United States Patent
Ran et al.

(10) Patent No.: US 11,190,208 B2
(45) Date of Patent: Nov. 30, 2021

(54) TECHNIQUES FOR LINK PARTNER ERROR REPORTING

(71) Applicant: Intel Corporation, Santa Clara, CA (US)

(72) Inventors: Adee Ofir Ran, Maayan Baruch (IL); Amir Mezer, Haifa (IL); Alon Meisler, Haifa (IL); Assaf Benhamou, Haifa (IL); Itamar Levin, Holon (IL); Yoni Landau, Or-Aqiva (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/905,200

(22) Filed: Jun. 18, 2020

(65) Prior Publication Data

US 2020/0321978 A1 Oct. 8, 2020

Related U.S. Application Data

(63) Continuation of application No. 16/324,172, filed as application No. PCT/US2017/050684 on Sep. 8, 2017, now Pat. No. 10,924,132.

(Continued)

(51) Int. Cl.
*G06F 11/00* (2006.01)
*H03M 13/01* (2006.01)
(Continued)

(52) U.S. Cl.
CPC ......... *H03M 13/015* (2013.01); *H03M 13/09* (2013.01); *H03M 13/13* (2013.01);
(Continued)

(58) Field of Classification Search
CPC ............... H03M 13/015; H03M 13/09; H03M 13/1515; H03M 13/353; H03M 13/15; H03M 13/13; H04L 1/203
See application file for complete search history.

(56) References Cited

U.S. PATENT DOCUMENTS 9,344,219 B2 * 5/2016 Ran .................... H04L 1/0045
2006/0123285 A1 6/2006 De Araujo et al.
(Continued)

FOREIGN PATENT DOCUMENTS

WO 2016048492 3/2016

OTHER PUBLICATIONS

Notice of Allowance for U.S. Appl. No. 16/324,172, dated Oct. 26, 2020.
(Continued)

*Primary Examiner* — Samir W Rizk
(74) *Attorney, Agent, or Firm* — Essential Patents Group, LLP.; Christopher K. Gagne

(57) ABSTRACT

Computing devices and techniques for providing link partner health reporting are described. In one embodiment, for example, an apparatus may include at least one memory, and logic, at least a portion of the logic comprised in hardware coupled to the at least one memory, the logic to determine a plurality of error counters, each of the plurality of error counters associated with a number of errors, determine the number of errors for each data unit of a plurality of data units associated with a data block, increment each of the plurality of error counters corresponding with the number of errors for each data unit of the plurality of data units, provide a plurality of error counts for the data block to a link partner, the plurality of error counts corresponding to the number of errors accumulated in each of the plurality of error counters for the data block, and reset the plurality of error counters. Other embodiments are described and claimed.

33 Claims, 13 Drawing Sheets

Related U.S. Application Data

(60) Provisional application No. 62/385,812, filed on Sep. 9, 2016.

(51) Int. Cl.
    *H03M 13/09*     (2006.01)
    *H03M 13/15*     (2006.01)
    *H03M 13/35*     (2006.01)
    *H03M 13/13*     (2006.01)
    *H04L 1/20*     (2006.01)

(52) U.S. Cl.
    CPC ....... *H03M 13/15* (2013.01); *H03M 13/1515* (2013.01); *H03M 13/353* (2013.01); *H04L 1/203* (2013.01)

(56) References Cited

U.S. PATENT DOCUMENTS

| | | |
|---|---|---|
| 2007/0204201 A1 | 8/2007 | Gower et al. |
| 2011/0050705 A1 | 3/2011 | Wada et al. |
| 2014/0380132 A1 | 12/2014 | Ran |
| 2016/0020870 A1 | 1/2016 | Ganga et al. |
| 2016/0042809 A1 | 2/2016 | Kim et al. |
| 2016/0249070 A1 | 8/2016 | Whitby-Strevens |

OTHER PUBLICATIONS

Approved Minutes, IEEE P802.3bs 200GbE & 400GbE Task Force, Interim Meeting, Sep. 12-14, 2016, Fort Worth, TX, USA, 15 pages.
IEEE P802.3bs D2.0 Gb/s & 400 Gb/s Ethernet Initial Working Group ballot comments, Sep. 29, 2016, 103 pages.
International Preliminary Report on Patentability for PCT Application No. PCT/US2017/050684, dated Mar. 21, 2019.
International Search Report for PCT Application No. PCT/US2017/050684, dated Jan. 5, 2018.
Non-Final Office Action for U.S. Appl. No. 16/324,172, dated Apr. 7, 2020.
Notice of Allowance for U.S. Appl. No. 16/324,172, dated Jul. 22, 2020.
Preliminary Amendment for U.S. Appl. No. 16/324,172, filed Feb. 8, 2019.
Written Opinion of the International Searching Authority for PCT Application No. PCT/US2017/050684, dated Jan. 5, 2018.
Ran, A. "802.3bs presentations for Sep. 2016", Link health and SER degradation signaling, Sep. 2016.
Ran, Adee, STDS-802-3-400G, IEEE P802.3bs, Sep. 2016—Agenda and Call for Presentation.
Ran, Adee, "Analysis of SER Degradation Parameters—Comments #40", IEEE P802.3bs, Sep. 2016.
Ran, Adee, "Link Health Reporting, Comment #44", IEEE P802.3bs, Sep. 2016.
Ran, Adee, "Link Health Reporting, Comment #44, Supporters Tongtong Wang", IEEE P802.3bs, Sep. 2016.

* cited by examiner

| i | Expected counting errors (multiplicity count of c_i equals to i) | c_i stored | Max count |
|---|---|---|---|
| 1 | 2773 | 12 | 4095 |
| 2 | 2037 | 12 | 4095 |
| 3 | 996 | 11 | 2047 |
| 4 | 364 | 9 | 511 |
| 5 | 106 | 8 | 255 |
| 6 | 26 | 6 | 63 |
| 7 | 5.4 | 5 | 31 |
| 8 | 0.98 | 4 | 15 |
| 9 | 0.16 | 3 | 7 |
| 10 | 2.3E-2 | 3 | 7 |
| 11 | 3.0E-3 | 2 | 3 |
| 12 | 3.6E-4 | 2 | 3 |
| 13 | 4.0E-05 | 2 | 3 |
| 14 | 4.1E-06 | 1 | 1 |
| 15 | 3.9E-07 | 1 | 1 |
| 16 or more | 3.8E-08 | 1 | 1 |
| Total | | 82 | |

| i | Expected count before 1000 yrs (minimum contaminant zone inflow) | # bits for Ci | Max count |
|---|---|---|---|
| 1 | 1386 | 11 | 2047 |
| 2 | 1018 | 11 | 2047 |
| 3 | 498 | 10 | 1023 |
| 4 | 182 | 9 | 511 |
| 5 | 53 | 7 | 127 |
| 6 | 13 | 6 | 63 |
| 7 | 2.7 | 5 | 31 |
| 8 | 0.49 | 4 | 15 |
| 9 | 0.079 | 3 | 7 |
| 10 | 1.1E-2 | 3 | 7 |
| 11 | 1.5E-3 | 2 | 3 |
| 12 | 1.8E-4 | 2 | 3 |
| 13 | 2.0E-05 | 2 | 3 |
| 14 | 2.0E-06 | 1 | 1 |
| 15 | 2.0E-07 | 1 | 1 |
| 16 | 1.9E-08 | 1 | 1 |
| Total (Don't care (UC)) | | 82 | |

| Expected count in 2^32 GCMs (all-match-complement-bits-into-valid-codewords-unaltered) | LSBs | Max-count Max-count |
|---|---|---|
| 2773 | 3 | 4088 |
| 2037 | 3 | 4088 |
| 996 | 3 | 2040 |
| 364 | 1 | 510 |
| 106 | 1 | 254 |
| 26 | 1 | 62 |
| 5.4 | 1 | 30 |
| 0.98 | 1 | 14 |
| 0.16 | 0 | 6 |
| 2.3E-2 | 0 | 3 |
| 3.0E-3 | 0 | 3 |
| 3.6E-4 | 0 | 1 |
| 4.0E-05 | 0 | 1 |
| 4.1E-06 | 0 | 1 |
| 3.9E-07 | 0 | 1 |
| 3.8E-08 | 0 | 1 |
| Total | | 64 |

FIG. 9

| Identicals (i.c.) | Expected count in 3.82 GWs (Identically counted after initial filtering of untrusted) | # pts w/ i.c. identicals | LSBs | # pts count |
|---|---|---|---|---|
| 1 | 2773 | 9 | 3 | 4088 |
| 2 | 2037 | 9 | 3 | 4088 |
| 3 | 996 | 8 | 3 | 2040 |
| 4 | 364 | 8 | 1 | 510 |
| 5 | 106 | 7 | 1 | 254 |
| 6 | 26 | 5 | 1 | 62 |
| 7 | 5.4 | 4 | 1 | 30 |
| 8 | 0.98 | 3 | 1 | 14 |
| 9 | 0.16 | 2 | 1 | 6 |
| 10 | 2.3E-2 | 2 | 0 | 3 |
| 11 | 3.0E-3 | 2 | 0 | 3 |
| 12 | 3.6E-4 | 1 | 0 | 1 |
| 13 | 4.0E-05 | 1 | 0 | 1 |
| 14 | 4.1E-06 | 1 | 0 | 1 |
| 15 | 3.9E-07 | 1 | 0 | 1 |
| 16 | 3.8E-08 | 1 | 0 | 1 |
| Total | | 64 | | |

*FIG. 10*

TECHNIQUES FOR LINK PARTNER ERROR REPORTING

CROSS-REFERENCE TO RELATED APPLICATION

This application claims the benefit of U.S. Provisional Application Ser. No. 62/385,812 filed Sep. 9, 2017, entitled "Techniques for Link Partner Error Reporting," which application is incorporated herein by reference in its entirety.

TECHNICAL FIELD

Embodiments described herein generally relate to communications between devices in communication networks and, more specifically, but not exclusively, to techniques for error reporting in high-speed communication links.

BACKGROUND

An important feature of network communication is data integrity. For example, communication standards, such as Ethernet, include methods for detecting and correcting transmission errors. High-speed communication networks, for example, networks operating at speeds of 10 gigabit/second (Gb/s) or greater, generally experience higher error rates than low-speed networks that operate at lower speeds. For example, the bit error rate (HER) and/or symbol error rate (SER) may be increased for high-speed networks. Accordingly, error detection and correction methods for low-speed networks may not work for high-speed networks. Forward error correction (FEC) has been proposed as an error correction process for high-speed networks. However, such conventional error correction processes do not provide for sufficient reporting among linked network components and are also not capable of avoiding error detection false positives and false negatives that degrade network performance.

BRIEF DESCRIPTION OF THE DRAWINGS

FIG. 7 illustrates a first bit allocation for a maximum allocation embodiment.

FIG. 8 illustrates a second bit allocation for a maximum allocation embodiment.

FIG. 9 illustrates a bit allocation for a minimum allocation embodiment.

FIG. 10 illustrates a bit allocation for a flat allocation embodiment.

DETAILED DESCRIPTION

Figure 1:
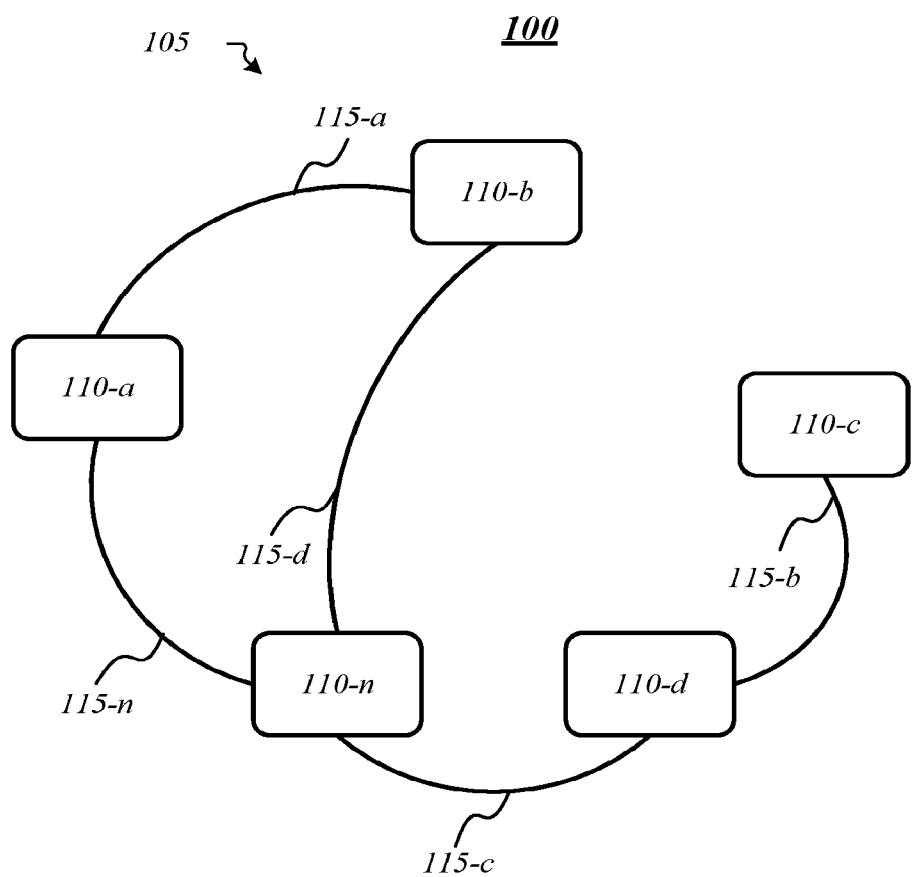
FIG. 1 illustrates an embodiment of a first operating environment.

Various embodiments may be generally directed to techniques for error detection and/or error reporting for compute nodes in a communications network. In some embodiments, a compute node may operate an error correction process for detecting communication errors. A non-limiting example of an error correction process may include a forward error correction (FEC) process, for instance, as defined and/or proposed in various Institute of Electrical and Electronics Engineers (IEEE) 802.3 standards and modifications and revisions thereto, such as IEEE 802.3bs (for example, IEEE P802.3bs Draft 2.0, entitled "Draft Standard for Ethernet Standard: Media Access Control Parameters, Physical Layers and Management Parameters for 200 Gb/s and 400 Gb/s Operation") and/or IEEE 802.3cd (for example, IEEE P802.3cd, entitled "Standard for Ethernet Amendment: Media Access Control Parameters for 50 Gb/s and Physical Layers and Management Parameters for 50 Gb/s, 100 Gb/s, and 200 Gb/s Operation").

In some embodiments, an error correction process may determine a number of corrected error elements in a data unit. In general, a data unit may include a predefined or standard data unit size used for processing data within a computing system and/or communication network, and a corrected error element may include a segment of the data unit. For example, a corrected error element may include a bit, byte, symbol, and/or the like. In some embodiments, a data unit may include a codeword size used in an error correction process, such as FEC, and the corrected error element may include a symbol of the codeword. For instance, in some embodiments, the error correction process may determine the number of corrected symbol errors in a codeword data unit. In some embodiments, the error correction process may define an uncorrectable data unit based on an error threshold. For example, an uncorrectable data unit may include a data unit having a number of corrected error elements above the error threshold. For example, an uncorrectable codeword may be a codeword having a number of errors greater than a symbol error threshold of 15 symbol errors.

In various embodiments, the error correction process may monitor error events by maintaining error correction counters to track the number of corrected errors in the data units. In some embodiments, the error correction counters may be maintained using one or more hardware and/or software implemented databases, arrays, registers, tables, data structures, combinations thereof, and/or the like. For example, the error correction process may maintain an error correction counter for each value of corrected errors up to the error threshold. In some embodiments, the error correction counters may include a counter for uncorrectable codewords (for instance, codewords with a number of errors over a threshold). In an embodiment in which the error threshold is fifteen, the error correction process may maintain a first counter for data units having one error correction, a second counter for data units having two error correction, a third counter for data units having three error corrections, and so on up to a fifteenth counter for data units having fifteen or more error corrections. In general, the threshold may be set to a value configured to indicate a communication issue (for example, based on a mean time to uncorrected codeword (MTTUC) determination) with a compute node and another compute node and/or a corresponding communication network.

The error correction information may be reported to various nodes within a network. For example, a server node may report error correction information to a switch node within the network. The switch node may use the error correction information to maintain an error correction database, determine a graph or other form of historical error correction information, and/or make certain determinations (for instance, MTTUC). The error correction information may be reported using various allocation techniques according to some embodiments. For example, in some embodiments, error correction information may be reported in-band within transmitted blocks (for instance, alignment markers (AMs)), within an FEC architecture. In some embodiments, an AM may include the error correction information, such as error event counts, that have occurred since a previous AM. Embodiments are not limited in this context. In some embodiments, the error correction information (for instance, error counts) may be reset for each data block. In various embodiments, a data block may include information between successive AMs. In exemplary embodiments, the error correction information may include an error count for each number of errors and/or a count of uncorrectable data units.

Various embodiments may comprise one or more elements. An element may comprise any structure arranged to perform certain operations. Each element may be implemented as hardware, software, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Embodiments herein are generally directed to wired and/or wireless communications systems. Various embodiments are particularly directed to communications performed according to one or more wired and/or wireless communications standards. Some embodiments may involve wired and/or wireless communications performed according to one or more of the IEEE 802.3 standards, including, without limitation, as proposed in IEEE 802.3bs and IEEE 802.3cd and drafts, revisions, developments, or other modifications thereof (such as IEEE 802.3bs Draft 3.3). Some embodiments may involve communications performed over high-speed networks, such as networks operating at 10 gigabit/second (Gb/s), 40 Gb/s, 100 Gb/s, 200 Gb/s, 400 Gb/s, 500 Gb/s, 1000 Gb/s, values or ranges between any two of these values (including endpoints).

Although communication networks according to IEEE 802.3, and IEEE 802.3bs and 802.3cd in particular, are described herein, embodiments are not so limited. For example, any communication standard capable of performing according to some embodiments is contemplated herein. Accordingly, some embodiments may additionally or alternatively involve wired and/or wireless communications according to one or more other wired and/or wireless communication standards. Examples of other wired and/or wireless communications technologies and/or standards that may be used in various embodiments may include, without limitation, other IEEE wireless communication standards such as IEEE 802.11, IEEE 802.11a. IEEE 802.11b. IEEE 802.11g, IEEE 802.11n, IEEE 802.11u, IEEE 802.11ac, IEEE 802.11ad, IEEE 802.11af, and/or IEEE 802.11ah, IEEE 802.3, IEEE 802.3ah, IEEE 802.3ae, IEEE 802.3ak, IEEE 802.3an, IEEE 802.3bj, IEEE 802.3bn, IEEE 802.3 bp, IEEE 802.3bq, IEEE 802.3bw, IEEE 802.3by, IEEE 802.3bz, and/or any developments, revisions, or any other variations of any of the foregoing.

FIG. 1 illustrates an example of an operating environment 100 that may be representative of various embodiments. In operating environment 100, a communication network 105 may include a plurality of nodes 110a-n connected via one or more communication links ("links" or "connections") 115a-n. The nodes 110a-n may include various types of computing and network devices, including, without limitation, servers, personal computers (PCs), workstations, mobile computing devices, hubs, routers, switches, network storage devices, non-volatile memory storage devices, and/or the like. The links 115a-n may include wired or wireless connections, including, but not limited to, Wi-Fi connections, Ethernet connections, fiber optic connections, coaxial connections, combinations thereof, and/or the like. Nodes 110a-n that are connected to each other within the network 105 may be referred to as "link partners." For example, node 110-a is a link partner of node 110-b and vice versa. Accordingly, node 110-a may communicate with node 110-b via communication link 115-a, for example, using an Ethernet communications protocol such as proposed in IEEE 802.3bs. In some embodiments, network 105 may be configured as a mesh network. Communication errors may occur at one or more of nodes 10a-n. Conventional error detection and/or correction methods, such as conventional FEC processes, may be used to address such communication errors. However, existing FEC processes do not report error information directly between link partners. A link partner, such as node 110-a, may obtain error information about another link partner, such as node 110-b, through various protocols, such as a network management protocol. However, such information is not readily available among link partners, for example, to allow for management of a node with poor link health immediately and efficiently. Accordingly, as described in more detail herein, some embodiments may provide for effective link health reporting among link partners in a manner that allows a link partner to obtain and/or generate meaningful link health information to make network management decisions.

Figure 2:
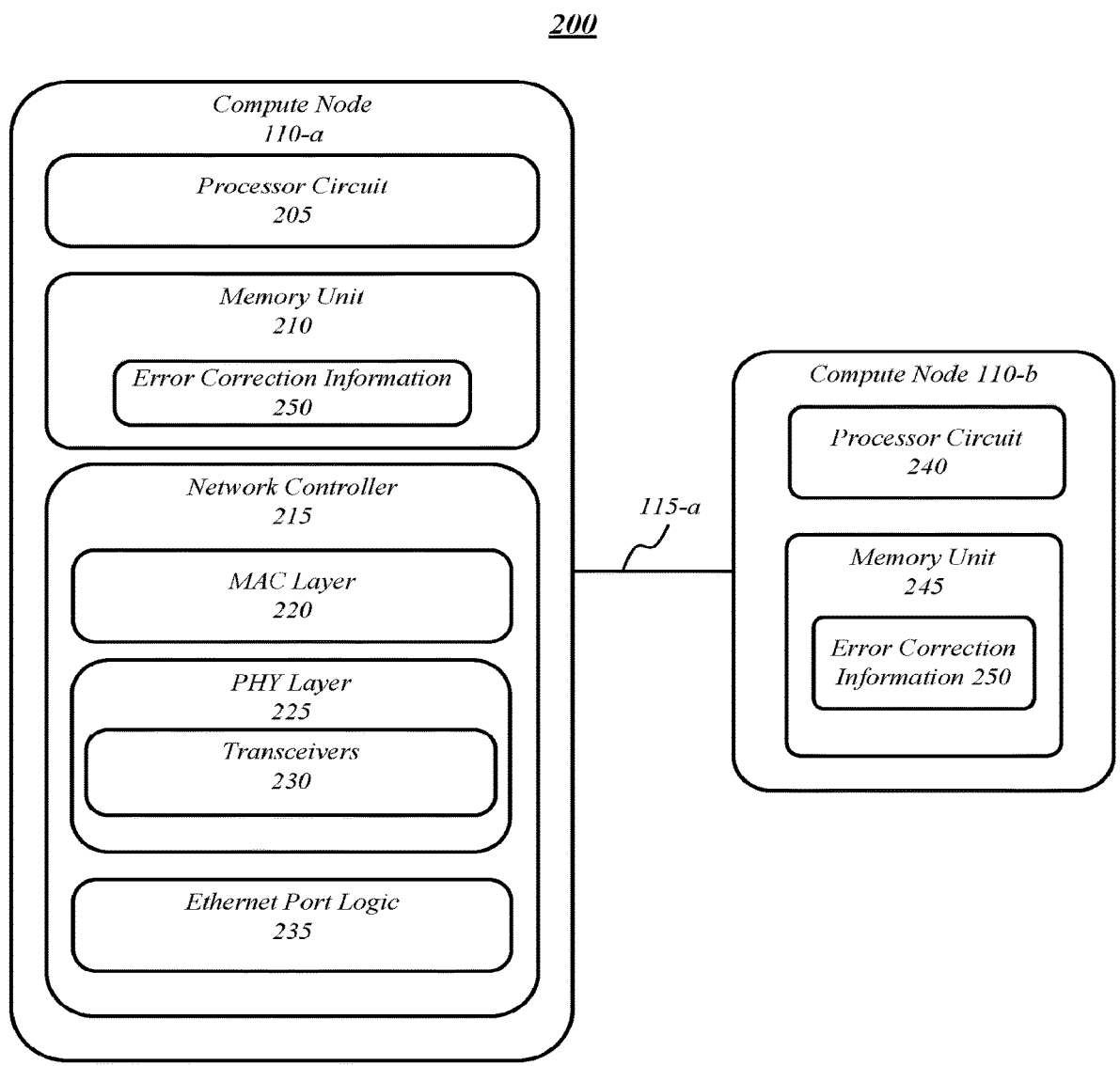
FIG. 2 illustrates an embodiment of a second operating environment.

FIG. 2 illustrates an example of an operating environment 200 that may be representative of various embodiments. As shown in FIG. 2, node 110-a may include a processor circuit 205 and a memory unit 210. In some embodiments, node 110-a may include a server, and processor circuit 205 and memory unit 210 may be operative to execute various services and applications on the server. Node 110-a may include a network controller 215 configured to facilitate communications with node 110-b, a link partner of node 110-a. The network controller 215 may include a media access control (MAC) layer 220 configured to provide, for example, addressing and channel access control protocols for communication with node 110-a. The MAC layer 220 may be configured for data encapsulation (for example, transmit and receive), framing (for example, frame boundary delimitation, frame synchronization), addressing (for example, handling of source and destination addresses), error detection (for example, detection of physical medium transmission errors), and/or the like. Additional and/or alternative operations and features of the MAC layer 220 may be defined by the aforementioned Ethernet communications protocols. The embodiments are not limited in this context.

In various embodiments, the network controller 215 may include a physical (PHY) layer module 225 ("PHY layer," "PHY module," or "PHY circuitry") generally configured to interface with node 110-b via link 115-a. In some embodiments, PHY layer 225 may be implemented in hardware, software, or a combination thereof. In some embodiments, PHY layer 225 may include circuitry that complies with or is otherwise compatible with various aforementioned communication protocols, such as various IEEE 802.3 protocols, including, for example, IEEE 802.3bs and IEEE 802.3cd. In some embodiments, PHY layer 225 may include one or more transceivers 230 configured to transmit/receive data packets and/or frames to/from node 110-*b* (and any other link partners). In some embodiments, the transceivers 230 may include transmit (Tx) circuitry and receiver (Rx) circuitry for sending and receiving data packets and/or frames to/from link partners, such as node 110-*b*.

In some embodiments, network controller 215 may include an Ethernet port logic (or error correction logic) 235 configured to perform an error correction process. For example, network controller 215 may include a FEC module configured to perform an FEC error correction process on packets sent and/or received by network controller 215 (for example, see FIGS. 3 and 4). Error correction logic 235 may be implemented in hardware, software, or a combination of hardware and software. As used in this application, the terms "logic," "component," "layer," "system," "circuitry," and/or "module" are intended to refer to a computer-related entity, either hardware, a combination of hardware and software, software, or software in execution, examples of which are provided by the exemplary computing architecture 700. For example, a logic, circuitry, or a layer may be and/or may include, but are not limited to, a process running on a processor, a processor, a hard disk drive, multiple storage drives (of optical and/or magnetic storage medium), an object, an executable, a thread of execution, a program, a computer, hardware circuitry, integrated circuits, application specific integrated circuits (ASIC), programmable logic devices (PLD), digital signal processors (DSP), field programmable gate array (FPGA), memory units, logic gates, registers, semiconductor device, chips, microchips, chip sets, software components, programs, applications, firmware, software modules, computer code, combinations of any of the foregoing, and/or the like.

In exemplary embodiments, error correction logic 235 may be configured to perform an FEC error correction process according to some embodiments based on FEC error correction processes described in various communication protocols, such as defined in IEEE 802.3 and/or proposed in IEEE 802.3bs and/or 802.3cd and/or developments, drafts, revisions, or other modifications thereto. Error correction logic 235 may be configured to generate, receive, transmit, report, analyze, or otherwise manage error correction information 250 according to some embodiments. In various embodiments, error correction information 250 may include statistics relating to the detection and/or correction of errors of packets transmitted and/or received by node 110-*a*.

As shown in FIG. 2, node 110-*b* may include a processor circuit 240 and a memory unit 245. In some embodiments, node 110-*b* may include network equipment, such as a switch or router, and processor circuit 240 and memory unit 245 may be operative to execute various services and applications on the switch or router. In some embodiments, memory unit 245 may be configured to generate, receive, and/or otherwise obtain error correction information 250. In some embodiments, the error correction information may include statistics relating to the detection and/or correction of errors of packets transmitted and/or received by node 110-*a*, node 110-*b*, and/or other nodes within network 105. For example, in some embodiments, error correction information 250 may include a number of corrected errors for a data unit, such as a codeword used in a FEC error correction process performed by error correction logic.

Figure 3:
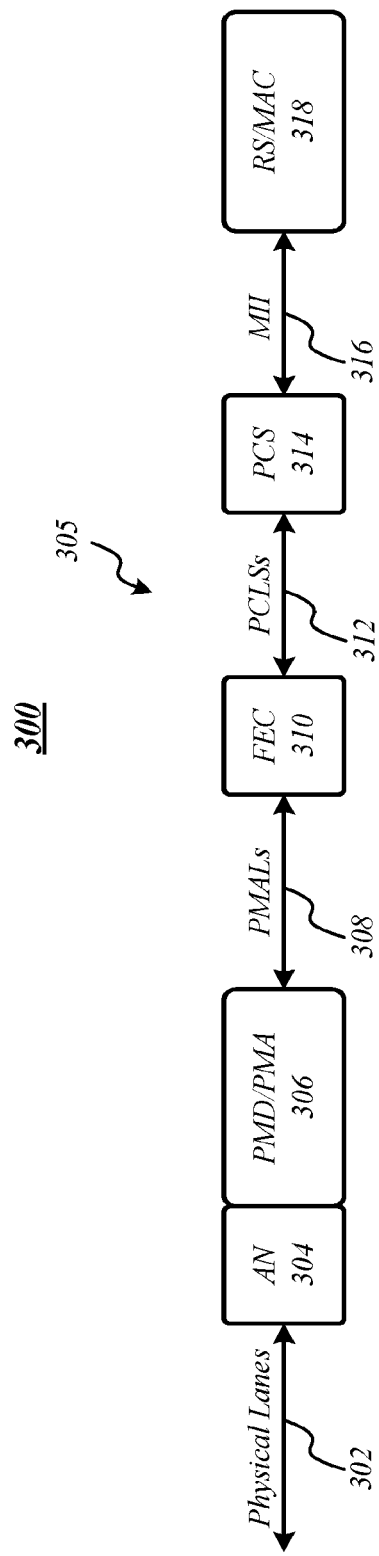
FIG. 3 illustrates an embodiment of a third operating environment.

FIG. 3 illustrates an example of an operating environment 300 that may be representative of various embodiments. As shown in FIG. 3, an Ethernet port logic 305 is capable of communication over one or more physical communication lanes 302. In some embodiments, Ethernet port logic may be and/or may be a portion of Ethernet port logic 235 depicted in FIG. 2. Ethernet port logic 305 may include a physical coding sublayer (PCS) 314 capable of operating, for example, at about 25 gigabits per second (Gb/s) per logical PCS lane. Ethernet port logic 305 may also include forward error correction (FEC) logic that generates FEC codewords that are aligned by a predefined offset with alignment markers (AMs) included on each logical PCS lane. Ethernet port logic 305 may support scaling to high Ethernet bit rates (for example, 50 Gb/s with 2 PCS lanes, 400 Gb/s with 16 PCS lanes, or 25 Gb/s with a single PCS lane). The alignment marker scheme used by Ethernet port logic 305 is compatible with RS-FEC encoding and may allow for fast synchronization of 25 Gb/s RS-FEC. Additionally, although illustrated as an Ethernet port logic, it should be understood that Ethernet port logic 305 may be embodied as any network port logic implementing a different network architecture that is capable of implementing functions according to some embodiments.

In some embodiments, Ethernet port logic 305 includes an auto-negotiation (AN) logic 304, a physical medium dependent (PMD) sublayer/physical medium attachment (PMA) sublayer 306, a forward error correction (FEC) logic 310, a physical coding sublayer (PCS) logic 314, and a reconciliation sublayer/media access control sublayer (MAC) logic 318. In various embodiments, one or more of logic components depicted in FIG. 3 may be incorporated in, or otherwise form a portion of, another component. For example, part or all of AN logic 104, PMD/PMA sublayer 306, and/or FEC logic 310 logic may be incorporated in the PCS logic 314.

Physical lanes 302 may be embodied as any one or more computer communication links. For example, each physical lane 302 may be embodied as a twisted pair conductor, an optical fiber, or an electrical backplane connection. In some embodiments, each physical lane 302 may be capable of full-duplex operation. For example, each physical lane 302 may include two pairs of electrical conductors, one pair for transmitting data and the other pair for receiving data. In one example, the communication lanes 302 may include one communication lane operating at 400 Gh/s, four communication lanes operating at 100 Gb/s each, or eight communication lanes operating at 50 Gb/s each (for 400 Gb/s total bandwidth). In another example, communication lanes 302 may include a single physical lane 302 operating at 25 Gb/s. In a further example, communication lanes 302 may include five communication lanes 302 operating at 100 Gb/s each or 10 communication lanes 302 operating at 50 Gb/s each (for 500 Gb/s total bandwidth). In a still further example, communication lanes 302 may include two communication lanes 302 operating at 400 Gb/s each (for 800 Gb/s total bandwidth). Although described as operating at a data rate of about 25 Gb/s, it should be understood that in some embodiments communications lanes 302 may operate at a slightly higher signaling rate, such as 25.78125 Gb/s, to allow for additional data for line encoding, error correction, and/or other additional data.

MAC logic 318 may be configured to transmit Ethernet frame data to PCS logic 314 to be encoded and transmitted, and to receive data from PCS logic 314 to produce Ethernet frame data. MAC logic 318 may communicate with PCS logic 314 via a media-independent interface (MII) 116. For example, MAC logic 318 may communicate via a media-independent interface (MII) 316 similar to a 40 gigabit media independent interface (XLGMII), a 100 gigabit media independent interface (CGMII), or any appropriate interface. MAC logic 318 may perform Ethernet frame detection and validation, packet reception and transmission, cyclic redundancy check (CRC) validation, CRC computation, and other media access control sublayer operations.

PCS logic 314 may be configured to encode Ethernet frame data received from MAC logic 318 into encoded data blocks that may be transmitted by PMD/PMA logic 306, and to decode data received from PMD/PMA logic 306 into decoded Ethernet frame data that may be processed by MAC logic 318. PCS logic 314 may encode and distribute the data blocks over one or more logical PCS lanes (PCSLs) 312. Each PCS lane 312 may operate at about 25 Gb/s, or may operate at a higher speed, such as about 50 Gb/s. PCS logic 314 may encode data for transmission over communication lanes 302 to improve communication efficiency. For example, encoding the data may add timing or synchronization symbols, align the data, add state transitions to the encoded data to improve clock recovery, adjust the DC balance of the data signal, or otherwise prepare the encoded data for serial transmission. PCS logic 314 may be capable of encoding or decoding the data using a 64b/66b line code in which 64-bit blocks of data are encoded into 66-bit blocks of encoded data, and vice versa.

PCS logic 314 may further be configured to regularly insert alignment markers into the encoded data stream on each PCS lane 312. For example, PCS logic 314 may insert an alignment marker (or "AM") after every 16,383 encoded blocks transmitted on each PCS lane 312. The alignment markers may be embodied as predetermined 66-bit data blocks, and each PCS lane 312 may be associated with a unique, predetermined alignment marker. In some embodiments, the alignment markers may include a unique block type field, for example, a block type field that is not used by other control blocks. In some embodiments, the unique block type field may be embodied as, for example, an octet equal to 0x33.

FEC logic 310 may be configured to apply a FEC code to the data passed over PCS lanes 312 between PMD/PMA logic 306 and PCS logic 314. For instance, FEC logic 310 may encode data passed from PCS logic 314 to PMD/PMA logic 306 and decode data passed from PMD/PMA logic 306 to PCS logic 314. FEC logic 310 may generate FEC codewords having a certain length or size. For example, in some embodiments, the FEC codewords may have a size of about 544 symbols (for instance, for Ethernet FEC), which each symbol being about 10 bits long. In some embodiments, a data unit (such as a codeword) may have 2 symbols, 4 symbols, 8 symbols, 16 symbols, 32 symbols, 50 symbols, 64 symbols, 100 symbols, 200 symbols, 300 symbols, 400 symbols, 500 symbols, 544 symbols, 600 symbols, 1000 symbols, and/or a size or range between any two of these values (including endpoints). In various embodiments, the FEC codewords may include an 80-block FEC codeword. In some embodiments, up to 15 symbols of a FEC codeword may be corrected; accordingly, a codeword with 16 or more symbols errors is "uncorrectable."

In exemplary embodiments, the FEC codewords may start at a predefined block offset from the alignment markers inserted by PCS logic 314, without removing or re-inserting the alignment markers. Additionally or alternatively, FEC logic 310 may remove alignment markers from PCS lanes 312 and then reinsert the alignment markers following the next (544 symbol or 80-block) FEC codeword. The FEC process operative according to some embodiments may, among other things, improve the reliability of data transmission at higher line speeds. In various embodiments, FEC logic 310 may include a Reed-Solomon (RS) FEC (RS-FEC) code or logic. In other embodiments, FEC logic 310 may apply any appropriate FEC code or logic. FEC logic 310 may communicate with PMD/PMA logic 306 over one or more PMA lanes 308. In some embodiments, PMA lanes 308 may each be equivalent to a PCS lane 312; that is, the Ethernet port logic 305 may include the same number of PMA lanes 308 and PCS lanes 312, and each PMA lane 308 may operate at the same speed as PCS lanes 312. In some embodiments, Ethernet port logic 305 may include different numbers of PMA lanes 308 and/or PCS lanes 312. In some embodiments, Ethernet port logic 305 may not include FEC logic 310 and/or FEC logic 310 may be optional. In embodiments that do not include FEC logic 310, PCS logic 314 may be coupled directly to PMD/PMA logic 306.

In some embodiments, PMD/PMA logic 306 may be configured to transmit and receive serial binary data over communication lanes 302. PMD/PMA logic 306 may also multiplex data from multiple PCS lanes 312 and/or PMA lanes 308 onto a single physical lane 302, and demultiplex data from each physical lane 302 onto multiple PCS lanes 312. For example, PMD/PMA logic 306 may multiplex 16 PCS lanes 312 at 25 Gb/s each onto a plurality of physical lanes 302 or 16 PCS lanes 312 at 25 Gb/s each onto a plurality of physical lanes 302 at 25 Gb/s. In some embodiments, PMD/PMA logic 306 may transmit and receive data for a single PCS lane 312 via a single physical lane 302, without performing any multiplexing.

AN logic 304 may be configured to auto-negotiate line transmission speed, mode of operation, and other communication parameters with a link partner when physical lane 302 is brought up. AN logic 304 may be embodied as a state machine or other logic capable of implementing an auto-negotiation protocol. For example, AN logic 304 may implement the auto-negotiation protocol specified by clause 73 of the IEEE 802.3 specification, clause 37 of the IEEE 802.3 specification, or the serial gigabit media independent interface (SGMII) auto-negotiation protocol (or other IEEE 802.3 standards, such as IEEE 802.3bs, IEEE 802.3cd, and/or the like). Although illustrated in FIG. 3 as coupled between PMD/PMA logic 306 and communication lanes 302, in other embodiments, AN logic 304 may be included at different positions in Ethernet port logic 305. For example, in some embodiments AN logic 304 may be coupled between PMD/PMA logic 306 and FEC logic 310.

Figure 4:
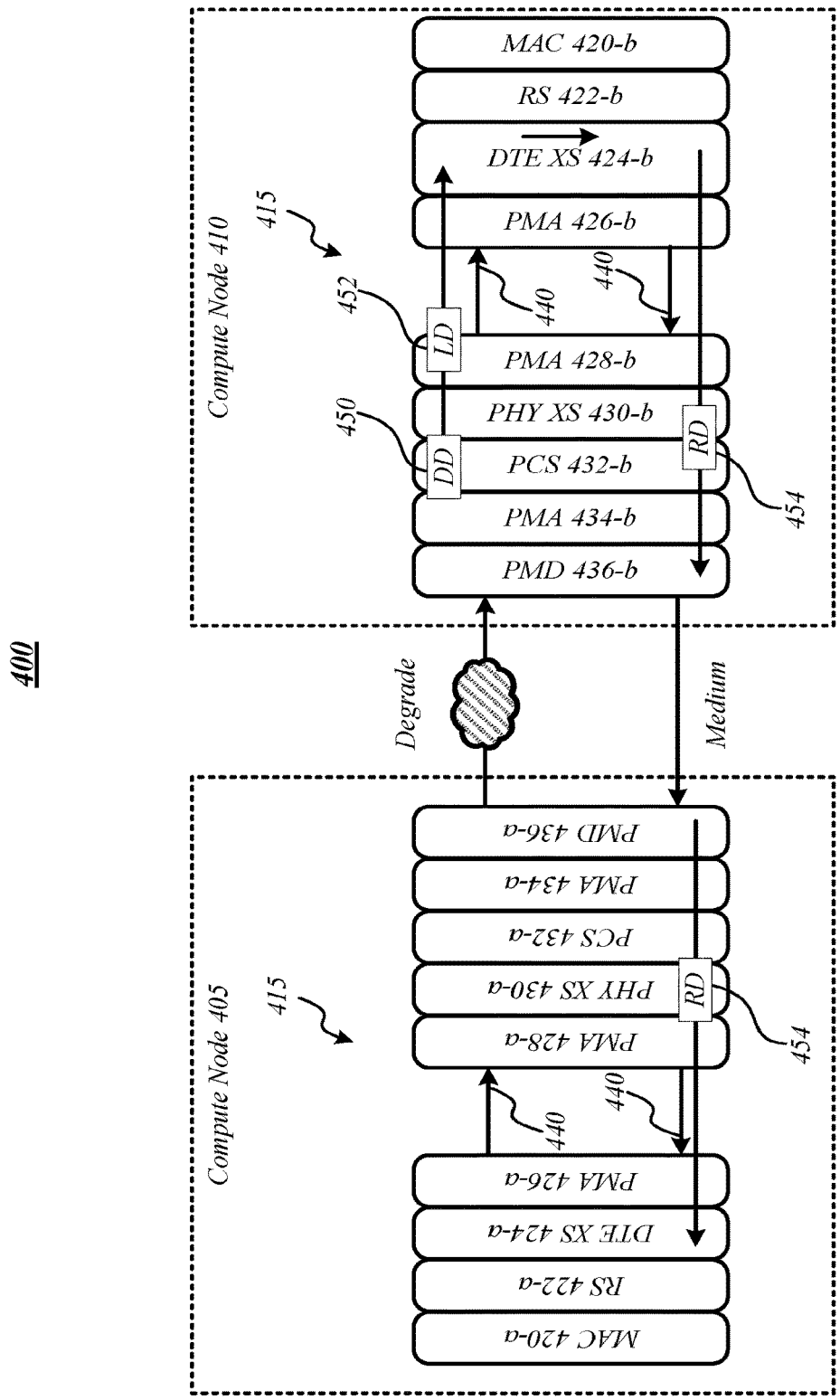
FIG. 4 illustrates an embodiment of a fourth operating environment.

FIG. 4 illustrates an example of an operating environment 400 such as may be representative of some embodiments. In some embodiments, an error correction process may be operative to provide, among other things, FEC symbol error rate (SER) degradation or FEC bit error rate (BER) degradation (for instance, pre-FEC SER, pre-FEC BER, and/or the like). FEC SER degradation may be operative to signal a degradation condition to a link partner (for instance, node 110-a may signal a degradation condition to node 110-b). Operating environment 400 may be configured to perform FEC SER degradation between compute node 405 and compute node 410. For example, operating environment 400 may be configured to perform FEC SER degradation as proposed in IEEE 802.3bs, such as proposed in Draft 2.0 thereof. Each of compute node 405 and compute node 410 may have an architecture configured according to various communication standards. In some embodiments, the architecture may include a protocol stack 415 that may include various sublayers. Non-limiting examples of the sublayers may include a MAC sublayer 420-a and 420-b, a reconciliation sublayer (RS) 422-a and 422-b, a DTS extended sublayer (XS) sublayer 424-a and 424-b, a physical medium attachment (PMA) sublayers 426-a and 426-b and 428-a and 428-b, a PHY sublayer 430-a and 430-b, a physical coding sublayer (PCS or new PCS) 432-a and 432-b, a physical medium dependent (PMD) sublayer 434-a and 434-b, variations thereof, combinations thereof, and/or the like. Various components of the architecture, such as sublayers of protocol stack 415 may communicate over various channels 440, such as CDAUI or 400GAUI having a plurality of channels, such as 8, 16, or more channels.

As shown in FIG. 4, PCS 432-b at compute node 410 may determine a degrade detection (DD) 450 as a result of exceeding a pre-FEC SER threshold and may send a local degrade (LD) signal 452 to DTE XS 424-b at compute node 410. DTE XS 424-b at compute node 410 may send a remote degrade (RD) signal 454 to DTE XS 424-a at compute node 405. In some embodiments, network traffic may be unaffected by LD signal 452 and/or RD signal 454. In some embodiments, the degradation condition may be configurable through various parameters, such as three 32-bit parameters.

In some embodiments, a baseline configuration of the FEC SER process may include a 400 gigabit (400G) link with stationary noise and small margins. The baseline configuration may include various communication segments, such as an optical fiber (or "optical") segment with a BER of $1 \times 10^{-4}$ (for instance, with ~0.27 dB margin to $2.4 \times 10^{-4}$). The PMD specified maximum may be BER $2.4 \times 10^{-4}$, so $1 \times 10^{-4}$ may include a ~0.27 dB optical power margin. The baseline configuration may include chip-to-chip (C2C) and/or chip-to-module (C2M) segments, such as two C2C+C2M segments with a total BER of $2 \times 10^{-5}$. C2M may have a specified maximum BER of $1 \times 10^{-5}$, and C2C may have a specified maximum SER of $1 \times 10^{-4}$, which can be translated to BER=$1 \times 10^{-6}$. Accordingly, the baseline configuration may include an optical HER of $1 \times 10^{-4}$, an electrical BER of $2 \times 10^{-3}$, for a total BER of $1.2 \times 10^{-4}$.

The baseline configuration of the FEC SER process according to some embodiments may be operative to handle various use cases. For example, a first use case may involve a degradation of an optical signal (for instance, consuming the margin) (an "optical signal degradation use case"). In another example, a second use case may involve non-stationary noise conditions, such as electrical segments that create a BER of $2 \times 10^{-4}$ on average, but as BER of $2 \times 10^{-4}$ in 10% of the time, for instance, with a cycle period of 1 microsecond (µs) (a "non-stationary noise conditions use case"). The baseline configuration may be configured to detect the optical signal degradation use case (for example, a signal to noise (SNR) degradation of about 0.25 dB).

The optical signal degradation use case for the baseline configuration having no error propagation may result in a SER of $1.2 \times 10^{-4}$ with an expected frame loss ratio of $4.75 \times 10^{-17}$. The mean time to uncorrectable codeword (MT-TUC) may be about 12 years. False packet acceptance involves a packet having an error passing through error correction processes. A mean time to false packet acceptance (MTTFPA) may not be an issue if uncorrectable errors are marked. With error marking bypassed, MTTFPA may be less than six billion years such that error monitoring may trigger errors constantly (for instance, not enough margin for bypassing error marking). In the optical signal degradation use case, SNR degradation may be 0.25 dB such that total BER is $1.76 \times 10^{-4}$, SER is $1.75 \times 10^{-5}$, FLR is $8.22 \times 10^{-15}$, MTTUC is 20 days, which may be unacceptable for efficient and effective network communications.

Figure 5:
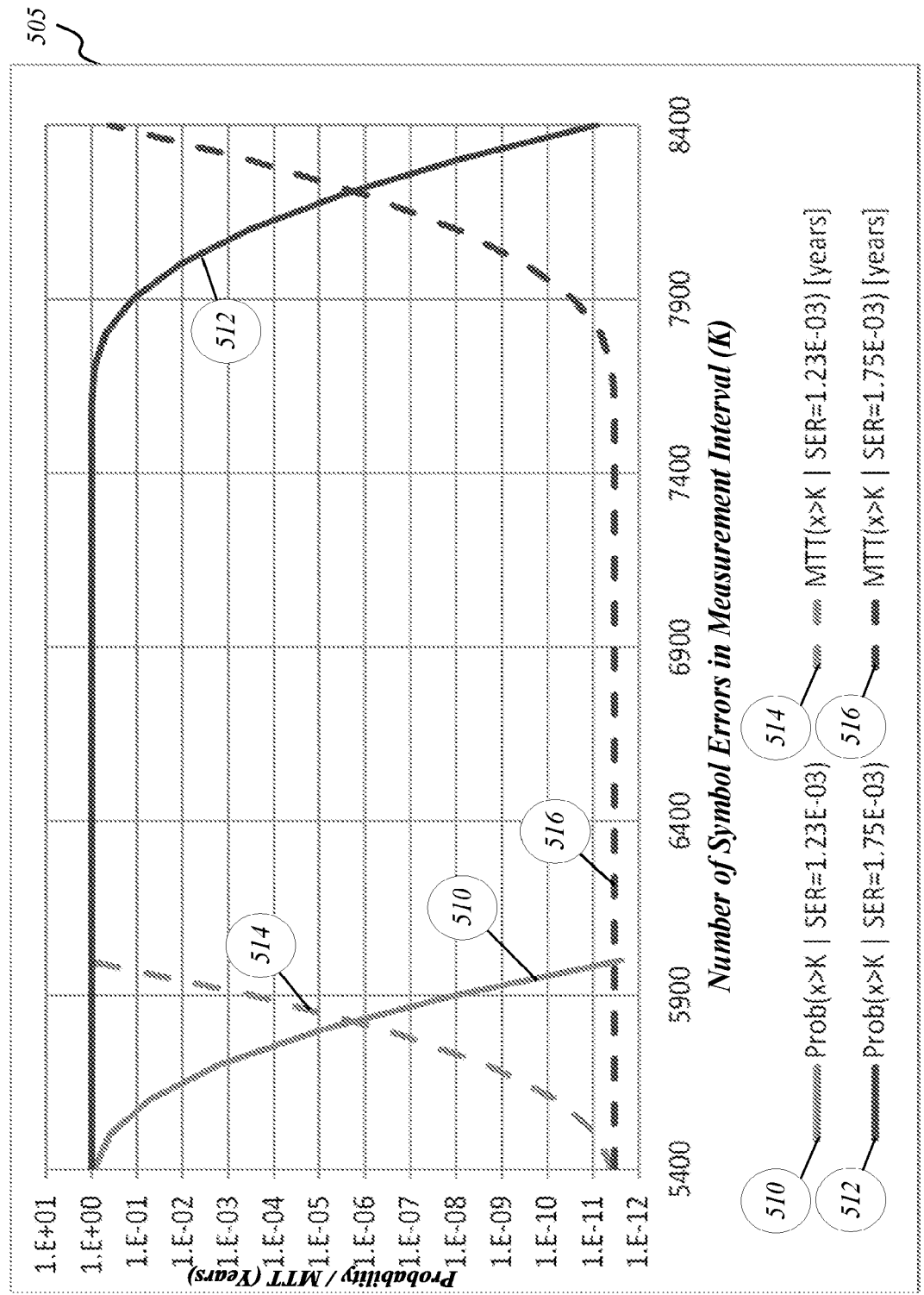
FIG. 5 depicts a graph of a first use case for a baseline configuration according to some embodiments.

FIG. 5 depicts a graph of the optical signal degradation use case for the baseline configuration of an error correction process according to some embodiments. More specifically, FIG. 5 depicts graphs for probabilities with a SER of $1.23 \times 10^{-3}$ 510 and a SER of $1.275 \times 10^{-3}$ 512, and MTT with a SER of $1.23 \times 10^{-3}$ 514 and a SER of $1.275 \times 10^{-3}$ 516 (in years). The FEC degraded SER interval is 8192 (for example, as in bypass indication monitoring). In general, MT may include mean time to the event that x>K, where K is the horizontal axis. In a SER degradation feature, such an event may generate an alert such that MT may be implemented as a mean time to alert (MITA). MTT(x>K) may be expressed in years, while probability may be a dimensionless number. Lower probability may be correlated with higher MTT(x>K) and vice versa.

As shown in FIG. 5, in a first example, with a SER of $1.23 \times 10^{-3}$, the expected number of symbol errors in 8192 codewords is about 5480. In a second example, with a SER of $1.75 \times 10^{-3}$, the expected number of symbol errors in 8192 codewords is about 7802. Accordingly, large expected numbers may create steep curves when exceeded. In addition, significant differences in expectation may enable good distinction (for instance, many orders of magnitude for determining, for example, a mean time to alert (MTTA)).

In some embodiments, a FEC degraded SER assert threshold (for instance, a FEC_degraded_SER_assert_threshold parameter) may be determined based on various use cases, such as the optical signal degradation use case depicted in FIG. 5. Based on graphs 510-516, a FEC degraded SER assert threshold may be set at between about 6000 and about 8000. In some embodiments, a large distance between alerts may create hysteresis and prevent noisy alerts. With a FEC degraded SER assert threshold at 8000, a SER of $1.24 \times 10^{-4}$, may not or may substantially not generate false alerts and a SER of $1.75 \times 10^{-4}$ may generate an immediate (true) alert.

Figure 6:
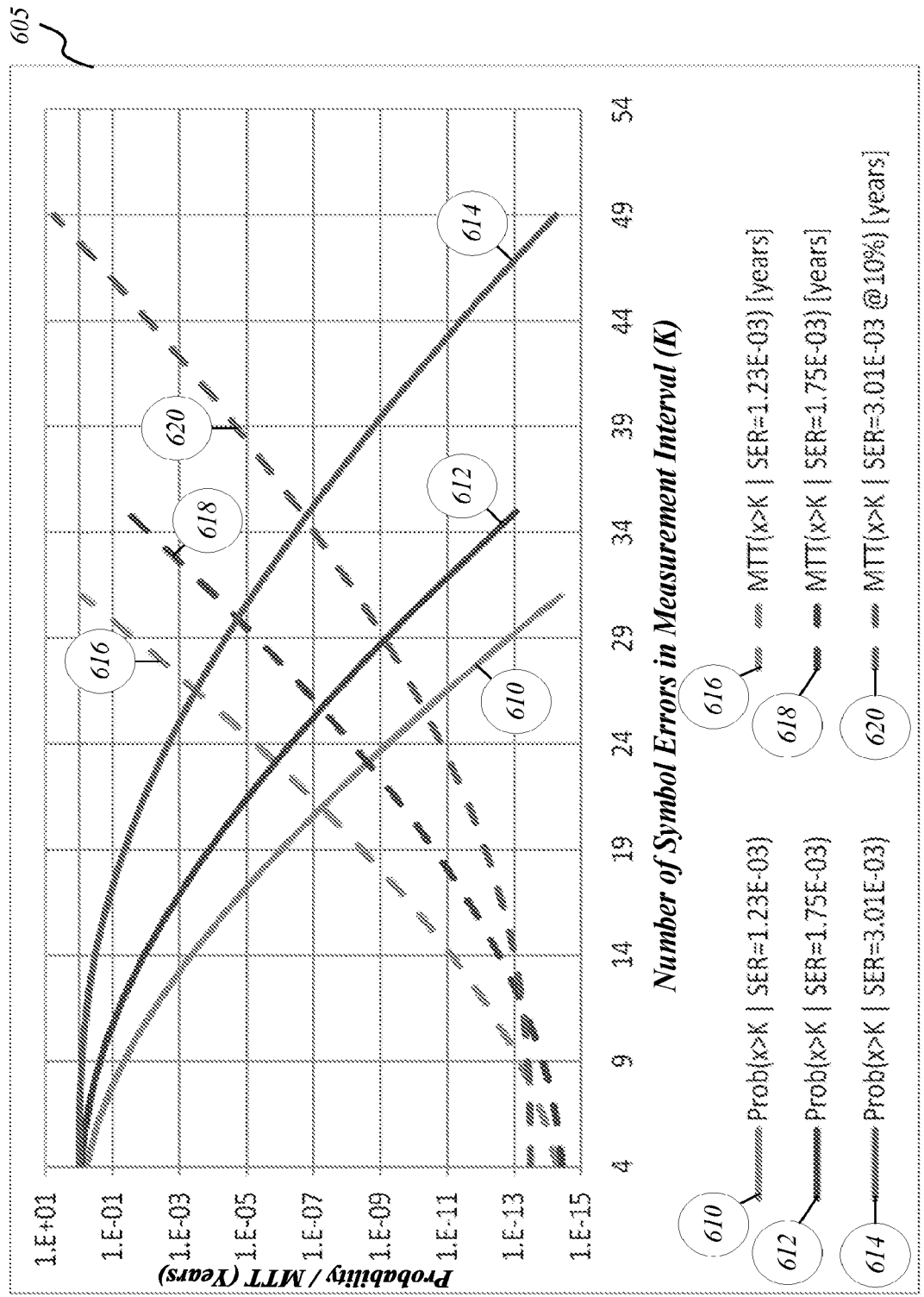
FIG. 6 depicts a graph of the first use case and a second use case for the baseline configuration according to some embodiments.

FIG. 6 depicts a graph of the optical signal degradation use case and the non-stationary noise conditions use case for the baseline configuration according to some embodiments. More specifically, FIG. 6 depicts graphs 610 and 616 for the baseline configuration, graphs 612 and 618 for the optical signal degradation use case, and graphs 614 and 620 for the non-stationary noise conditions use case.

For the non-stationary noise conditions use case, electrical BER may be $2 \times 10^{-5}$ on average (as is the baseline configuration), and may be $2 \times 10^{-4}$ 10% of the time, with a negligible BER otherwise with a cycle period of 1 µs. The optical segment BER may be stationary at $1 \times 10^{-4}$, total BER may be $1 \times 10^{-4}$ 90% of the time and $4 \times 10^{-4}$ 10% of the time. Accordingly, the non-stationary noise conditions use case may result in an SER of $1.04 \times 10^{-4}/4.01 \times 10^{-4}$, respectively, effective based on the following weighted sum: $1.04 \times 10^{-4} * 0.9 + 4.01 \times 10^{-4} * 0.1 = 1.24 \times 10^{-4}$. FLR for the non-stationary noise conditions use case is $2.46 \times 10^{-18}/2.55 \times 10^{-11}$, respectively, effective based on the following weighted sum: $2.46 \times 10^{-18} * 0.9 + 2.55 \times 10^{-11} * 0.1 = 2.55 \times 10^{-12}$. In the non-stationary noise conditions use case, a high-SER period occurred for 100 nanoseconds (ns) at 400G with a codeword duration of 12.8 ns, with about 8 codewords during the duration. The non-stationary noise conditions use case had a MTTUC of 1.7 hours (including accounting for the 10% factor).

Referring to FIG. 6, detection of the non-stationary noise conditions use case using the FEC SER degradation process may include using a FEC_degraded_SER_interval parameter shorter than 80 codewords; otherwise, the cycle may be averaged out, leading to only seeing an average SER. Using a FEC_degraded_SER_interval parameter of 8 codewords (for example, minimum averaging) may lead to stationary noise creating an SER of $1.24 \times 10^{-4}$ (for instance, a baseline SER), with an <SE(8)> of 5.45. In the high-SER period of the non-stationary noise conditions use case, SER is $4.01 \times 10^{-4}$, such that <SE(8)> changes to 14.1.

With an alert threshold set to 44, the non-stationary noise conditions use case would trigger an alert after about 4 seconds, baseline would take about 10 years to trigger an alert (hut, would eventually create an alert), and the optical signal degradation use case changes <SE(8)> to only 7.6 and would create an alert only about every 3-4 days. Accordingly, lower thresholds may increase false alerts in "good" scenarios, while higher thresholds may miss the optical signal degradation use case completely.

Based on the results of the optical signal degradation use case and the non-stationary noise conditions use case for the baseline configuration, threshold values may require higher margins; however, such threshold values may trigger an alert for links with very long MTTUC. Accordingly, in some embodiments, default parameter values may be used. For example, a FEC_degraded_SER_interval parameter may be set to a default of 8192, a FEC_degraded_SER_assert_threshold may be set to a default of 5560 (for example, due to a MTTFPA and/or uncorrectable codeword concern), and a FEC_degraded_SER_deassert_threshold parameter may be set to a default of 5000 (for instance, for a "healthy" link). In some embodiments, the parameter definitions may be changed to a single management data input/output (MDIO) register (for example, 16 bits each).

Conventional error correction, such as FEC and other error correction processes defined or proposed in IEEE 802.3, IEE4 802.3bs are not capable of reporting error counters to link partners, particularly with an immediate alert. Accordingly, network management functions would benefit from information such as MTTUC being too small. For example, conventional FEC degradation processes (for instance, FEC SER degradation) are limited to stationary error statistics and may miss short periods with more errors on average and may not be able to predict MTTUC values being too small. Efficient function of conventional error correction methods, such as FEC SER degradation, rely on setting threshold values correction, for example, depending on the type of BER detected, which must be performed on each link, or with XS, each segment of the link. As currently configured, conventional error correction methods, such as FEC SER degradation, are essentially binary in nature and fail to provide meaningful and timely information regarding detected and/or corrected errors. For example, in conventional FEC SER degradation, exceeding a threshold is a random event, which may happen at any link. As such, SER degradation may be asserted and de-asserted randomly. In a large network, such SER degradation assertion and de-assertion may happen much more often that actual uncorrectable codewords. However, network devices and/or network administrators may not be able to determine if an actual network problem exists.

Accordingly, an error correction process according to some embodiments may operate to provide meaningful and timely information for accessing error corrections, degradations, and/or other error events. In some embodiments, an uncorrectable codeword may be a codeword with a number of errors above an error correction threshold, such as 15 errors. Although 15 errors is used as a threshold in examples herein, embodiments are not so limited as this value is for illustrative purposes. In some embodiments, the error threshold may depend on the type and/or size of a data unit (for example, a percentage). In general, the error threshold may be determined as a value sufficient to specify an actual communication issue with a node or the network. In some embodiments, the error threshold may be 1 error, 2 errors, 4 errors, 4 errors, 5 errors, 6 errors, 7 errors, 8 errors, 9 errors, 10 errors, 11 errors, 12 errors, 14 errors, 14 errors, 15 errors, 16 errors, 20 errors, 50 errors, 100 errors, 200 errors, 300 errors, 500 errors, and any value or range between any two of these values (including endpoints). In some embodiments, the error threshold may be based on a percentage and not an absolute value. For example, the error threshold may be a number of errors that is 1% of the data unit (for instance, 5 errors for a data unit comprising 500 parts, such as 500 symbols or bits). In some embodiments, the error threshold may be about 1%, about 2%, about 2.7% (for instance, 15 errors/544 symbols in Ethernet FEC codeword), about 2.9% (for instance, 16 errors/544 symbols in Ethernet FEC codeword), about 3%, about 4%, about 5%, about 10%, about 20%, about 25%, about 50%, about 90%, and any value or range between any two of these values (including endpoints). Although codeword data units, such as Ethernet FEC codewords, have been used to describe certain examples, embodiments are not so limited, as any data unit capable of operating according to some embodiments is contemplated herein.

An error event in which a codeword has exactly "k" symbol errors may be denoted as "Ek" and a codeword with more than k symbol errors may be denoted as "Ek+." The probability of a specific codeword being uncorrectable may be p(Ek+) (for example, p(E15+) for 15 symbol errors). In some embodiments, codewords with a smaller number of errors are more likely, such that p(E16+)<p(E15)< P(E14) . . . <P(E). The assumption that codewords with a smaller number of errors are more likely holds for various channel models, including non-stationary and bursty channels; however, at high SER (as proposed in 802.3bs), p(E1) may be greater than p(E0).

In some embodiments, error correction information including a number of corrected symbol errors in a codeword may be available to the error correction process, for example, via the RS decoder, which may be used by a FEC SER degradation process. Accordingly, in some embodiments, the number of corrected symbols may be monitored, tracked, tabulated, or otherwise observed. In some embodiments, the error correction process may use error event counters (for example, C1 to C15 for an error correction threshold of 15) to track the number of codewords with a specific number of error corrections. In various embodiments, one or more counters may be used to count a number of uncorrectable codewords (for instance, C1 to C15 to count a number of correctable errors up to a threshold of 15 and C16 for uncorrectable codewords having greater than the threshold number of errors). In some embodiments, the error correction process may use a database, registers (for example, hardware registers and/or software registers), counters, tables, or other data structure to store and/or access the number of codewords with a specific number of error corrections. In various embodiments, the error correction information indicating the number of codewords with a specific number of error corrections may be used, for example, to assess a probability of each type of error event. For example, the tabulated error correction information may be used to assess the probability of each error event up to p(E15) and to extrapolate out to other values, such as p(E15+), p(E16+), and/or the like.

In some embodiments, the error correction information may be reported from a node to other nodes, such as to link partners. In some embodiments, the error correction information may be reported using in-band communications. In some embodiments, the error correction information may be reported using in-band communication that include alignment markers (or AMs). In general, an alignment marker may be used for identification of PCS lanes. In 400G, there may be 16 PCS lanes, with 2056 bits (8×257) once every 8192 codewords. In 200G, there may be 8 PCS lanes, with 1028 bits (4×257) once every 4096 codewords. In some embodiments, the AMs may include error event counts measured since a previous AM. For example, a current AM definition may include six unique octets per PCS lane and pad bits. A set of the AM bits may be used to send the error event counters. In some embodiments, the error event counters may include a count of E1 to E15 (or E15+, E16+, and/or the like). In various embodiments, the error event counters may be reset after the AM block has been sent, for example, to implement non-rollover of the error correction information. In various embodiments, the error event counters may be reset based on other conditions, such as after a threshold amount of time, occurrence of a specific event, a threshold number of AMs, and/or the like.

In various embodiments, a receiver (for instance, a node, a link partner, within a node (for example, a portion of the architecture of a node), and/or the like) may receive the error correction information. In some embodiments, a receiving node may accumulate the error correction information over time to create historical information, such as a "graph" of long-term error correction patterns. The graph of historical error correction information may be used, for example, to estimate certain error-related values and/or to generate alert policies. For instance, the error correction counts in the error correction information may be used to calculate a fitted probability and estimate MTTUC. An alert may be generated if the estimated MTTUC is lower than a threshold value. Accordingly, in some embodiments, the accumulated error correction information may capture more required information compared with conventional methods, even if a channel is not stationary, in contrast to conventional SER threshold methods. In some embodiments, accumulated counters may be mapped to MDIO registers at a receiver. In some embodiments, when a receiver receives an AM block from a link partner, the receiver may decode and accumulate the counters into 16-bit variables. In some embodiments, the decoded values may be mapped to MDIO registers, for example, that may be cleared on read. For example, in various embodiments, a variable array or other data structure may be defined for counting received codewords with 1 to a threshold number of errors (for instance, 15) and a number of uncorrected codewords. The variable array may include 16 integers, each 12 bits each, that include 15 registers for the count of 1 to 15 errors and one register for the number of uncorrected codewords.

In some embodiments, for a PCS adjacent to a PHY XS, the PHY XS effect can be added by taking the maximum of each counter and the corresponding counter received by the PHY XS PCS. In some embodiments, the maximum may represent the worst of the two segments, which may dominate the MTTUC, for example, if both segments use the same FEC. In some embodiments, for a PCS adjacent to a PHY XS, the maximum of each of the local counters and the corresponding counter received at the PHY XS PCS may be reported.

With decreasing probabilities of errors, some error correction counters may advance faster than other error correction counters. For example, C1 may advance faster than C10. Accordingly, embodiments may employ various methods for allocating bits for each counter in an AM block. In a "maximum allocation" embodiment, bits may be allocated according to expected counts between AMs, for example, in a minimally-compliant link. For example, each counter width may be set so that reaching the maximum count is a rare event (for instance, less than once a day). Such a maximum allocation embodiments may require different bits for different communication speeds, such as for 400G and 200G communication segments. FIG. 7 depicts table 705 for an illustrative bit allocation for the maximum allocation embodiment for 400G and FIG. 8 depicts table 805 for an illustrative bit allocation for the maximum allocation embodiment for 200G. In a "minimum allocation" embodiment, counters may be encoded with variable width within a 64-bit field. The minimum allocation embodiment may provide similar allocations for different communication speeds, such as for both 400G and 200G. FIG. 9 depicts table 905 for an illustrative bit allocation for the minimum allocation embodiment. In a "flat allocation" embodiment, 4 bits are allocated to each of the counters to form a 64-bit field. FIG. 10 depicts table 1005 for an illustrative bit allocation for the flat allocation embodiment. The flat allocation embodiment may provide similar allocations for different communication speeds, such as for both 400G and 200G (for instance, suitable for both 400G and 200G, with either a pad or per-lane octet). The flat allocation embodiment may be more efficient to encode and decode, and may have more loss of accuracy in lower k counters, while being sufficient for error correction assessments, such as an MTTUC assessment. In addition, the flat allocation embodiment may operate with communication segments of different speeds, such as 50G.

Compared with conventional FEC SER degradation, error correction processes according to some embodiments may capture required statistics to estimate MTTUC, even in non-stationary channels (for instance, no averaging across codewords). The error correction counter information may provide a "soft metric, which, among other things, may prevent false alerts and may be useful in "good" or "healthy" channels. In addition, error correction processes according to some embodiments may not require the setting of parameters in a remote (for instance, reporting) receiver.

Figure 11:
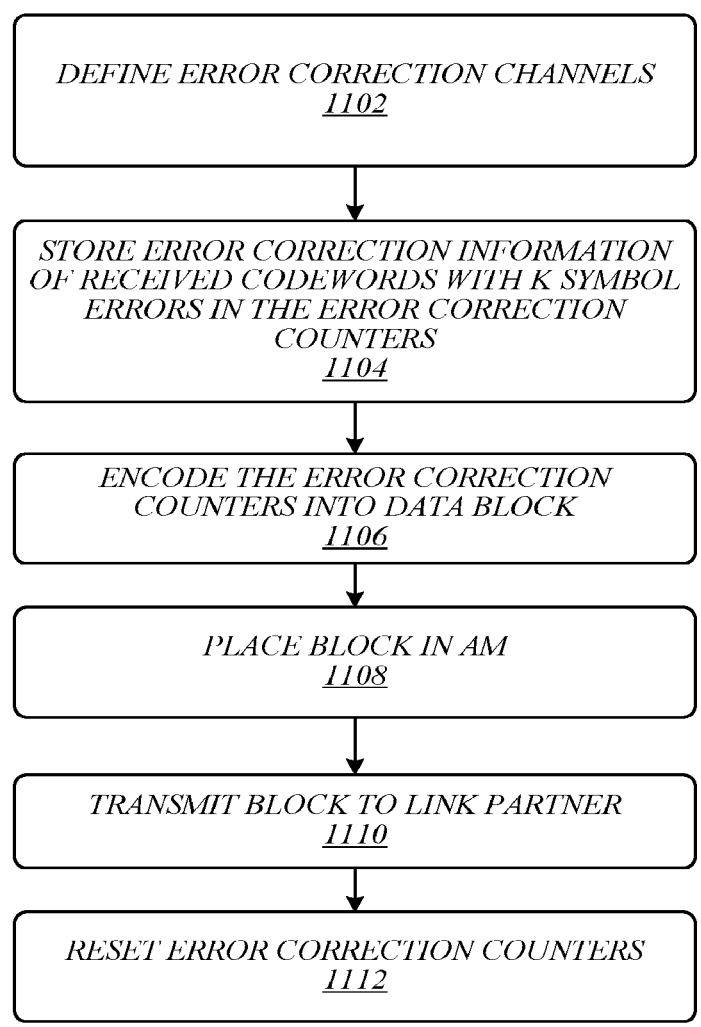
FIG. 11 depicts an illustrative logic flow according to a first embodiment.

Included herein is a flow chart representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation FIG. 11 depicts an illustrative logic flow according to a first embodiment. More specifically, FIG. 11 illustrates one embodiment of a logic flow 1100. The logic flow 1100 may be representative of some or all of the operations executed by one or more embodiments described herein. For example, the logic flow 1100 may illustrate operations performed by one or more of nodes 110a-n.

In the illustrated embodiment shown in FIG. 11, the logic flow 1100 may define error correction channels (or counters) at block 1102. For example, the error correction process may define 16 non-rollover, 12-bit counters (Ck, with k=1 to 16) in an RS decoder. In some embodiments, the counters may be used to count a number of errors for received codewords and a count of uncorrectable codewords. At block 1104, the logic flow may store error correction information of received codewords with k symbol errors in the error correction counters, for example, with k=16 being used to indicate or count an uncorrectable codeword. For example, if a codeword has 1 error, the error correction counter associated with 1 error (for instance, counter C1) may be incremented by 1, if a codeword has 2 errors, the error correction counter associated with 2 errors may be incremented by 1, and so on. In another example, an uncorrectable codeword counter may be incremented for each uncorrectable codeword.

The counters may be encoded into a data block at block 1106. For example, the counters may be encoded into a 64-bit block according to a flat allocation embodiment. In some embodiments, if not implemented, all-ones may be encoded instead. In some embodiments, to prevent long runs in good links, XOR with P4BS9 initialized to all-ones. The block may be placed into the AM at block 1108. For example, the block may be placed into the pad bits of the AM block transmitted to the link partner, with, for instance, am_mapped<1024:960> or am_mapped<1984:1920>, instead of the current pad contents. At block 1110, the AM block may be sent to the link partner. At block 1110, the error correction counters may be reset after the AM block has been transmitted.

Figure 12:
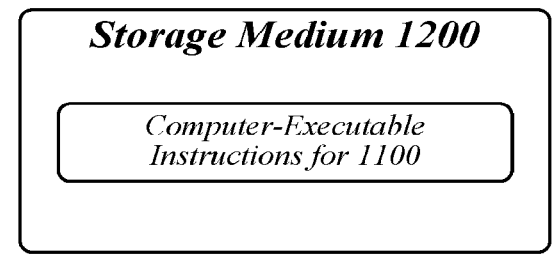
FIG. 12 illustrates an embodiment of a storage medium.

FIG. 12 illustrates an example of a storage medium 1200. Storage medium 1200 may comprise an article of manufacture. In some examples, storage medium 1200 may include any non-transitory computer readable medium or machine readable medium, such as an optical, magnetic or semiconductor storage. Storage medium 1200 may store various types of computer executable instructions, such as instructions to implement logic flow 1100. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 13:
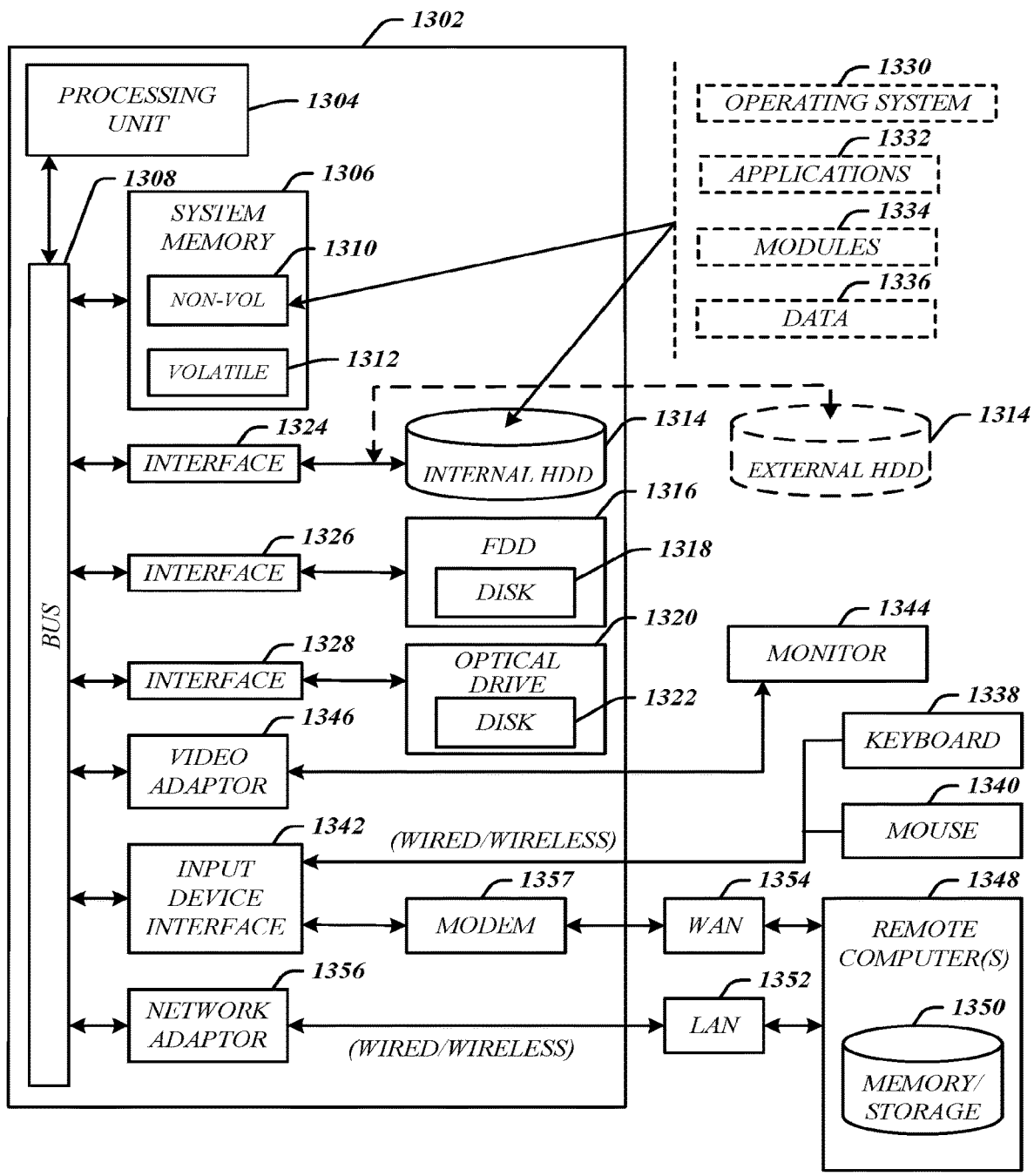
FIG. 13 illustrates an example computing platform.

FIG. 13 illustrates an embodiment of an exemplary computing architecture 1300 suitable for implementing various embodiments as previously described. In various embodiments, the computing architecture 1300 may comprise or be implemented as part of an electronic device. In some embodiments, the computing architecture 1300 may be representative, for example, of compute nodes 210, cloud controller 260, RSA controller 310, physical platform 415a-n, data center manager 430, apparatus 505, 605, and/or 705, and/or cloud orchestrator 820. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 1300. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 1300 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 1300.

As shown in FIG. 13, the computing architecture 1300 comprises a processing unit 1304, a system memory 1306 and a system bus 1308. The processing unit 1304 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 1304.

The system bus 1308 provides an interface for system components including, but not limited to, the system memory 1306 to the processing unit 1304. The system bus 1308 can be any of several types of bus structure that may further interconnect to a memory bus (with or without a memory controller), a peripheral bus, and a local bus using any of a variety of commercially available bus architectures. Interface adapters may connect to the system bus 1308 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 1306 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EE- PROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 13, the system memory 1306 can include non-volatile memory 1310 and/or volatile memory 1312. A basic input/output system (BIOS) can be stored in the non-volatile memory 1310.

The computer 1302 may include various types of computer-readable storage media in the form of one or more lower speed memory units, including an internal (or external) hard disk drive (HDD) 1314, a magnetic floppy disk drive (FDD) 1316 to read from or write to a removable magnetic disk 1318, and an optical disk drive 1320 to read from or write to a removable optical disk 1322 (e.g., a CD-ROM or DVD). The HDD 1314, FDD 1316 and optical disk drive 1320 can be connected to the system bus 1308 by a HDD interface 1324, an FDD interface 1326 and an optical drive interface 1328, respectively. The HDD interface 1324 for external drive implementations can include at least one or both of Universal Serial Bus (USB) and IEEE 1384 interface technologies.

The drives and associated computer-readable media provide volatile and/or nonvolatile storage of data, data structures, computer-executable instructions, and so forth. For example, a number of program modules can be stored in the drives and memory units 1310, 1312, including an operating system 1330, one or more application programs 1332, other program modules 1334, and program data 1336. In one embodiment, the one or more application programs 1332, other program modules 1334, and program data 1336 can include, for example, the various applications and/or components of compute nodes 210, cloud controller 260, RSA controller 310, physical platform 415a-n, data center manager 430, apparatus 505, 605, and/or 705, and/or cloud orchestrator 820.

A user can enter commands and information into the computer 1302 through one or more wire/wireless input devices, for example, a keyboard 1338 and a pointing device, such as a mouse 1340. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 1304 through an input device interface 1342 that is coupled to the system bus 1308, but can be connected by other interfaces such as a parallel port, IEEE 1384 serial port, a game port, a USB port, an IR interface, and so forth.

A monitor 1344 or other type of display device is also connected to the system bus 1308 via an interface, such as a video adaptor 1346. The monitor 1344 may be internal or external to the computer 1302. In addition to the monitor 1344, a computer typically includes other peripheral output devices, such as speakers, printers, and so forth.

The computer 1302 may operate in a networked environment using logical connections via wire and/or wireless communications to one or more remote computers, such as a remote computer 1348. The remote computer 1348 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1350 is illustrated. The logical connections depicted include wire/wireless connectivity to a local area network (LAN) 1352 and/or larger networks, for example, a wide area network (WAN) 1354. Such LAN and WAN networking environments are commonplace in offices and companies, and facilitate enterprise-wide computer networks, such as intranets, all of which may connect to a global communications network, for example, the Internet.

When used in a LAN networking environment, the computer 1302 is connected to the LAN 1352 through a wire and/or wireless communication network interface or adaptor 1356. The adaptor 1356 can facilitate wire and/or wireless communications to the LAN 1352, which may also include a wireless access point disposed thereon for communicating with the wireless functionality of the adaptor 1356.

When used in a WAN networking environment, the computer 1302 can include a modem 1358, or is connected to a communications server on the WAN 1354, or has other means for establishing communications over the WAN 1354, such as by way of the Internet. The modem 1358, which can be internal or external and a wire and/or wireless device, connects to the system bus 1308 via the input device interface 1342. In a networked environment, program modules depicted relative to the computer 1302, or portions thereof, can be stored in the remote memory/storage device 1350. It will be appreciated that the network connections shown are exemplary and other means of establishing a communications link between the computers can be used.

The computer 1302 is operable to communicate with wire and wireless devices or entities using the IEEE 802 family of standards, such as wireless devices operatively disposed in wireless communication (e.g., IEEE 802.13 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

One or more aspects of at least on embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following provide illustrative embodiments:

Example 1 is an apparatus to provide link health reporting, the apparatus comprising at least one memory, and logic, at least a portion of the logic comprised in hardware coupled to the at least one memory, the logic to determine a plurality of error counters, each of the plurality of error counters associated with a number of errors, determine the number of errors for each data unit of a plurality of data units associated with a data block, increment each of the plurality of error counters corresponding with the number of errors for each data unit of the plurality of data units, provide a plurality of error counts for the data block to a link partner, the plurality of error counts corresponding to the number of errors accumulated in each of the plurality of error counters for the data block, and reset the plurality of error counters.

Example 2 is the apparatus of Example 1, each of the plurality of data units comprising a codeword.

Example 3 is the apparatus of Example 1, each of the plurality of data units comprising a forward error correction (FEC) codeword.

Example 4 is the apparatus of Example 1, each of the plurality of data units comprising a 544-symbol codeword.

Example 5 is the apparatus of Example 1, a number of the plurality of error counters determined based on a threshold number of errors.

Example 6 is the apparatus of Example 1, a number of the plurality of error counters determined based on a threshold number of errors, the threshold number of errors based on a number of symbols in the data units.

Example 7 is the apparatus of Example 1, the number of errors comprising a count of corrected symbol errors.

Example 8 is the apparatus of Example 1, the data block associated with at least one alignment marker.

Example 9 is the apparatus of Example 1, the data block comprising data between successive alignment markers.

Example 10 is the apparatus of Example 1, the data block comprising data between successive alignment markers, the plurality of error counters reset for each of the successive alignment markers.

Example 11 is the apparatus of Example 1, the plurality of error counts provided to the link partner within an alignment marker associated with the data block.

Example 12 is the apparatus of Example 1, the plurality of error counts provided to the link partner within an alignment marker immediately following the data block.

Example 13 is the apparatus of Example 1, the logic to determine expected counts associated with the plurality of error counts.

Example 14 is the apparatus of Example 1, the logic to determine expected counts associated with the error counts, allocate hits for providing the plurality of error counts based on the expected counts.

Example 15 is the apparatus of Example 1, the logic to encode the plurality of error counts with variable width.

Example 16 is the apparatus of Example 1, the logic to encode the plurality of error counts within a 64-bit field of an alignment marker for the data block.

Example 17 is the apparatus of Example 1, the plurality of counters comprising 16 counters, the logic to encode the plurality of error counters in 4-bit fields within a 64-bit field of an alignment marker for the data block.

Example 18 is the apparatus of Example 1, the logic to encode the plurality of error counters within pad bits of an alignment marker for the data block.

Example 19 is the apparatus of Example 1, the plurality of error counts to indicate a mean time to uncorrected codeword (MTTUC).

Example 20 is the apparatus of Example 1, the plurality of error counters allocated within a Reed-Solomon (RS) element of a forward error correction (FEC) logic.

Example 21 is a system to provide link health reporting, comprising the apparatus according to any of Examples 1-20, and at least one network interface.

Example 22 is a method to provide link health reporting, the method comprising determining a plurality of error counters, each of the plurality of error counters associated with a number of errors, determining the number of errors for each data unit of a plurality of data units associated with a data block, incrementing each of the plurality of error counters corresponding with the number of errors for each data unit of the plurality of data units, providing a plurality of error counts for the data block to a link partner, the plurality of error counts corresponding to the number of errors accumulated in each of the plurality of error counters for the data block, and resetting the plurality of error counters.

Example 23 is the method of Example 22, each of the plurality of data units comprising a codeword.

Example 24 is the method of Example 22, each of the plurality of data units comprising a forward error correction (FEC) codeword.

Example 25 is the method of Example 22, each of the plurality of data units comprising a 544-symbol codeword.

Example 26 is the method of Example 22, a number of the plurality of error counters determined based on a threshold number of errors.

Example 27 is the method of Example 22, a number of the plurality of error counters determined based on a threshold number of errors, the threshold number of errors based on a number of symbols in the data units.

Example 28 is the method of Example 22, the number of errors comprising a count of corrected symbol errors.

Example 29 is the method of Example 22, the data block associated with at least one alignment marker.

Example 30 is the method of Example 22, the data block comprising data between successive alignment markers.

Example 31 is the method of Example 22, the data block comprising data between successive alignment markers, the plurality of error counters reset for each of the successive alignment markers.

Example 32 is the method of Example 22, the plurality of error counts provided to the link partner within an alignment marker associated with the data block.

Example 33 is the method of Example 22, the plurality of error counts provided to the link partner within an alignment marker immediately following the data block.

Example 34 is the method of Example 22, comprising determine expected counts associated with the plurality of error counts.

Example 35 is the method of Example 22, comprising determining expected counts associated with the error counts, allocating bits for providing the plurality of error counts based on the expected counts.

Example 36 is the method of Example 22, comprising encoding the plurality of error counts with variable width.

Example 37 is the method of Example 22, comprising encoding the plurality of error counts within a 64-bit field of an alignment marker for the data block.

Example 38 is the method of Example 22, the plurality of counters comprising 16 counters, comprising encoding the plurality of error counters in 4-bit fields within a 64-bit field of an alignment marker for the data block.

Example 39 is the method of Example 22, comprising encoding the plurality of error counters within pad bits of an alignment marker for the data block.

Example 40 is the method of Example 22, the plurality of error counts to indicate a mean time to uncorrected codeword (MTTUC).

Example 41 is the method of Example 22, the plurality of error counters allocated within a Reed-Solomon (RS) element of a forward error correction (FEC) logic.

Example 42 is a computer-readable storage medium, comprising a plurality of instructions to provide link health reporting that, when executed, enable processing circuitry to determine a plurality of error counters, each of the plurality of error counters associated with a number of errors, determine the number of errors for each data unit of a plurality of data units associated with a data block, increment each of the plurality of error counters corresponding with the number of errors for each data unit of the plurality of data units, provide a plurality of error counts for the data block to a link partner, the plurality of error counts corresponding to the number of errors accumulated in each of the plurality of error counters for the data block, and reset the plurality of error counters.

Example 43 is the computer-readable storage medium of Example 42, each of the plurality of data units comprising a codeword.

Example 44 is the computer-readable storage medium of Example 42, each of the plurality of data units comprising a forward error correction (FEC) codeword.

Example 45 is the computer-readable storage medium of Example 42, each of the plurality of data units comprising a 544-symbol codeword.

Example 46 is the computer-readable storage medium of Example 42, a number of the plurality of error counters determined based on a threshold number of errors.

Example 47 is the computer-readable storage medium of Example 42, a number of the plurality of error counters determined based on a threshold number of errors, the threshold number of errors based on a number of symbols in the data units.

Example 48 is the computer-readable storage medium of Example 42, the number of errors comprising a count of corrected symbol errors.

Example 49 is the computer-readable storage medium of Example 42, the data block associated with at least one alignment marker.

Example 50 is the computer-readable storage medium of Example 42, the data block comprising data between successive alignment markers.

Example 51 is the computer-readable storage medium of Example 42, the data block comprising data between successive alignment markers, the plurality of error counters reset for each of the successive alignment markers.

Example 52 is the computer-readable storage medium of Example 42, the plurality of error counts provided to the link partner within an alignment marker associated with the data block.

Example 53 is the computer-readable storage medium of Example 42, the plurality of error counts provided to the link partner within an alignment marker immediately following the data block.

Example 54 is the computer-readable storage medium of Example 42, the plurality of instructions, when executed, to enable the processing circuitry to determine expected counts associated with the plurality of error counts.

Example 55 is the computer-readable storage medium of Example 42, the plurality of instructions, when executed, to enable the processing circuitry to determine expected counts associated with the error counts, allocate bits for providing the plurality of error counts based on the expected counts.

Example 56 is the computer-readable storage medium of Example 42, the plurality of instructions, when executed, to enable the processing circuitry to encode the plurality of error counts with variable width.

Example 57 is the computer-readable storage medium of Example 42, the plurality of instructions, when executed, to enable the processing circuitry to encode the plurality of error counts within a 64-bit field of an alignment marker for the data block.

Example 58 is the computer-readable storage medium of Example 42, the plurality of counters comprising 16 counters, the logic to encode the plurality of error counters in 4-bit fields within a 64-bit field of an alignment marker for the data block.

Example 59 is the computer-readable storage medium of Example 42, the plurality of instructions, when executed, to enable the processing circuitry to encode the plurality of error counters within pad bits of an alignment marker for the data block.

Example 60 is the computer-readable storage medium of Example 42, the plurality of error counts to indicate a mean time to uncorrected codeword (MTTUC).

Example 61 is the computer-readable storage medium of Example 42, the plurality of error counters allocated within a Reed-Solomon (RS) element of a forward error correction (FEC) logic.

Example 62 is an apparatus to provide link health reporting, the apparatus comprising an error count determination means to determine a plurality of error counters, each of the plurality of error counters associated with a number of errors, determine the number of errors for each data unit of a plurality of data units associated with a data block, increment each of the plurality of error counters corresponding with the number of errors for each data unit of the plurality of data units, reset the plurality of error counters for each successive data block, and an error count transmission means to provide a plurality of error counts for the data block to a link partner, the plurality of error counts corresponding to the number of errors accumulated in each of the plurality of error counters for the data block.

Example 63 is the apparatus of Example 62, each of the plurality of data units comprising a codeword.

Example 64 is the apparatus of Example 62, each of the plurality of data units comprising a forward error correction (FEC) codeword.

Example 65 is the apparatus of Example 62, each of the plurality of data units comprising a 544-symbol codeword.

Example 66 is the apparatus of Example 62, a number of the plurality of error counters determined based on a threshold number of errors.

Example 67 is the apparatus of Example 62, a number of the plurality of error counters determined based on a threshold number of errors, the threshold number of errors based on a number of symbols in the data units.

Example 68 is the apparatus of Example 62, the number of errors comprising a count of corrected symbol errors.

Example 69 is the apparatus of Example 62, the data block associated with at least one alignment marker.

Example 70 is the apparatus of Example 62, the data block comprising data between successive alignment markers.

Example 71 is the apparatus of Example 62, the data block comprising data between successive alignment markers, the plurality of error counters reset for each of the successive alignment markers.

Example 72 is the apparatus of Example 62, the plurality of error counts provided to the link partner within an alignment marker associated with the data block.

Example 73 is the apparatus of Example 62, the plurality of error counts provided to the link partner within an alignment marker immediately following the data block.

Example 74 is the apparatus of Example 62, the error count transmission means to determine expected counts associated with the plurality of error counts.

Example 75 is the apparatus of Example 62, the error count transmission means to determine expected counts associated with the error counts, allocate bits for providing the plurality of error counts based on the expected counts.

Example 76 is the apparatus of Example 62, the error count transmission means to encode the plurality of error counts with variable width.

Example 77 is the apparatus of Example 62, the error count transmission means to encode the plurality of error counts within a 64-bit field of an alignment marker for the data block.

Example 78 is the apparatus of Example 62, the plurality of counters comprising 16 counters, the error count transmission means to encode the plurality of error counters in 4-bit fields within a 64-bit field of an alignment marker for the data block.

Example 79 is the apparatus of Example 62, the error count transmission means to encode the plurality of error counters within pad bits of an alignment marker for the data block.

Example 80 is the apparatus of Example 62, the plurality of error counts to indicate a mean time to uncorrected codeword (MTTUC).

Example 81 is the apparatus of Example 62, the plurality of error counters allocated within a Reed-Solomon (RS) element of a forward error correction (FEC) logic.

Example 82 system to provide link health reporting, comprising the apparatus according to any of Examples 62-81, and at least one network interface.

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. Hardware integrated circuitry for use in a network switch for being coupled to at least one Ethernet protocol network link partner via at least one Ethernet protocol link, the hardware integrated circuitry comprising:
   at least one machine-readable memory;
   hardware transceiver circuitry to be coupled via the at least one Ethernet protocol link to the at least one Ethernet protocol link partner, the hardware transceiver circuitry to be used in Ethernet protocol frame communication to be carried out between the network switch and the at least one network link partner via the at least one Ethernet protocol link;
   wherein, when the network switch is in operation, the hardware integrated circuitry is to perform operations comprising:

determining error information associated with received Ethernet protocol frame data, the error information comprising respective counts of codewords of the received Ethernet protocol frame data that include respective numbers of symbol errors, the respective counts of codewords comprising:
   a first count of codewords of the received Ethernet protocol frame data that include a first number of symbol errors; and
   a second count of codewords of the received Ethernet protocol frame data that include a second number of symbol errors, the second number of symbol errors being greater than the first number of symbol errors; and
storing the error information in the at least one machine-readable memory.

2. The hardware integrated circuitry of claim 1, wherein:
the respective counts of codewords comprise fifteen respective counts of codewords;
the respective numbers of symbol errors comprise fifteen respective numbers of symbol errors; and
the respective numbers of symbol errors are mutually different from each other.

3. The hardware integrated circuitry of claim 2, wherein:
the codewords of the received Ethernet protocol frame data comprise forward error correction (FEC) codewords; and
the hardware integrated circuitry comprises Reed-Solomon decoder circuitry for use in association with the error information.

4. The hardware integrated circuitry of claim 3, wherein:
when the network switch is in the operation, the network switch is to provide the error information to a network node for use in association with network management.

5. The hardware integrated circuitry of claim 3, wherein:
when the network switch is in the operation, the network switch is to provide the error information to the at least one Ethernet protocol link partner via the at least one Ethernet protocol link.

6. The hardware integrated circuitry of claim 3, wherein when the network switch is in the operation:
parameters associated with the respective numbers of symbol errors are configurable; and
following reading of the respective counts of codewords, the respective counts of codewords are to be cleared.

7. The hardware integrated circuitry of claim 3, wherein:
another network switch comprises the at least one Ethernet protocol link partner.

8. The hardware integrated circuitry of claim 3, wherein: the network switch is for use in router applications.

9. Non-transitory computer-readable storage medium storing instructions for being executed by hardware integrated circuitry, the hardware integrated circuitry being for use in a network switch, the network switch for being coupled to at least one Ethernet protocol network link partner via at least one Ethernet protocol link, the hardware integrated circuitry comprising at least one machine-readable memory and hardware transceiver circuitry, the hardware transceiver circuitry to be coupled via the least one Ethernet protocol link to the at least one Ethernet protocol network link partner, the instructions, when executed by the hardware integrated circuitry, resulting in the hardware integrated circuitry being configured to perform operations comprising:
carrying out, using the hardware transceiver circuitry, Ethernet protocol frame communication between the network switch and the at least one network link partner via the at least one Ethernet protocol link;
determining error information associated with received Ethernet protocol frame data, the error information comprising respective counts of codewords of the received Ethernet protocol frame data that include respective numbers of symbol errors, the respective counts of codewords comprising:
   a first count of codewords of the received Ethernet protocol frame data that include a first number of symbol errors; and
   a second count of codewords of the received Ethernet protocol frame data that include a second number of symbol errors, the second number of symbol errors being greater than the first number of symbol errors; and
storing the error information in the at least one machine-readable memory.

10. The non-transitory computer-readable storage medium of claim 9, wherein:
the respective counts of codewords comprise fifteen respective counts of codewords;
the respective numbers of symbol errors comprise fifteen respective numbers of symbol errors; and
the respective numbers of symbol errors are mutually different from each other.

11. The non-transitory computer-readable storage medium of claim 10, wherein:
the codewords of the received Ethernet protocol frame data comprise forward error correction (FEC) codewords; and
the hardware integrated circuitry comprises Reed-Solomon decoder circuitry for use in association with the error information.

12. The non-transitory computer-readable storage medium of claim 10, wherein:
when the network switch is in the operation, the network switch is to provide the error information to a network node for use in association with network management.

13. The non-transitory computer-readable storage medium of claim 10, wherein:
when the network switch is in the operation, the network switch is to provide the error information to the at least one Ethernet protocol link partner via the at least one Ethernet protocol link.

14. The non-transitory computer-readable storage medium of claim 10, wherein when the network switch is in the operation:
parameters associated with the respective numbers of symbol errors are configurable; and
following reading of the respective counts of codewords, the respective counts of codewords are to be cleared.

15. The non-transitory computer-readable storage medium of claim 10, wherein:
another network switch comprises the at least one Ethernet protocol link partner.

16. The non-transitory computer-readable storage medium of claim 10, wherein:
the network switch is for use in router applications.

17. A method implemented by hardware integrated circuitry, the hardware integrated circuitry being for use in a network switch, the network switch for being coupled to at least one Ethernet protocol network link partner via at least one Ethernet protocol link, the hardware integrated circuitry comprising at least one machine-readable memory and hardware transceiver circuitry, the hardware transceiver circuitry to be coupled via the least one Ethernet protocol link to the at least one Ethernet protocol network link partner, the method comprising:
- carrying out, using the hardware transceiver circuitry, Ethernet protocol frame communication between the network switch and the at least one network link partner via the at least one Ethernet protocol link;
- determining error information associated with received Ethernet protocol frame data, the error information comprising respective counts of codewords of the received Ethernet protocol frame data that include respective numbers of symbol errors, the respective counts of codewords comprising:
  - a first count of codewords of the received Ethernet protocol frame data that include a first number of symbol errors; and
  - a second count of codewords of the received Ethernet protocol frame data that include a second number of symbol errors, the second number of symbol errors being greater than the first number of symbol errors; and
- storing the error information in the at least one machine-readable memory.

18. The method of claim 17, wherein:
the respective counts of codewords comprise fifteen respective counts of codewords;
the respective numbers of symbol errors comprise fifteen respective numbers of symbol errors; and
the respective numbers of symbol errors are mutually different from each other.

19. The method of claim 18, wherein:
the codewords of the received Ethernet protocol frame data comprise forward error correction (FEC) codewords; and
the hardware integrated circuitry comprises Reed-Solomon decoder circuitry for use in association with the error information.

20. The method of claim 18, wherein:
when the network switch is in the operation, the network switch is to provide the error information to a network node for use in association with network management.

21. The method of claim 18, wherein:
when the network switch is in the operation, the network switch is to provide the error information to the at least one Ethernet protocol link partner via the at least one Ethernet protocol link.

22. The method of claim 18, wherein when the network switch is in the operation:
parameters associated with the respective numbers of symbol errors are configurable; and
following reading of the respective counts of codewords, the respective counts of codewords are to be cleared.

23. The method of claim 18, wherein:
another network switch comprises the at least one Ethernet protocol link partner.

24. The method of claim 18, wherein:
the network switch is for use in router applications.

25. Hardware integrated circuitry for use in association with at least one Ethernet protocol network link partner coupled to at least one Ethernet protocol link, the hardware integrated circuitry comprising:
at least one machine-readable memory;
hardware transceiver circuitry to be coupled via the at least one Ethernet protocol link to the at least one Ethernet protocol link partner, the hardware transceiver circuitry to be used in Ethernet protocol frame communication to be carried out with the at least one network link partner via the at least one Ethernet protocol link;
wherein, when the hardware integrated circuitry is in operation, the hardware integrated circuitry is to perform operations comprising:
- determining error information associated with received Ethernet protocol frame data, the error information comprising respective counts of codewords of the received Ethernet protocol frame data that include respective numbers of symbol errors, the respective counts of codewords comprising:
  - a first count of codewords of the received Ethernet protocol frame data that include a first number of symbol errors; and
  - a second count of codewords of the received Ethernet protocol frame data that include a second number of symbol errors, the second number of symbol errors being greater than the first number of symbol errors; and
- storing the error information in the at least one machine-readable memory.

26. The hardware integrated circuitry of claim 25, wherein:
the respective counts of codewords comprise fifteen respective counts of codewords;
the respective numbers of symbol errors comprise fifteen respective numbers of symbol errors; and
the respective numbers of symbol errors are mutually different from each other.

27. The hardware integrated circuitry of claim 26, wherein:
the codewords of the received Ethernet protocol frame data comprise forward error correction (FEC) codewords; and
the hardware integrated circuitry comprises Reed-Solomon decoder circuitry for use in association with the error information.

28. Non-transitory computer-readable storage medium storing instructions for being executed by hardware integrated circuitry, the hardware integrated circuitry being for use in association with at least one Ethernet protocol network link partner coupled to at least one Ethernet protocol link, the hardware integrated circuitry comprising at least one machine-readable memory and hardware transceiver circuitry, the hardware transceiver to be coupled via the at least one Ethernet protocol link to the at least one Ethernet protocol link partner, the instructions, when executed by the hardware integrated circuitry, resulting in the hardware integrated circuitry being configured to perform operations comprising:
- carrying out, using the hardware transceiver circuitry, Ethernet protocol frame communication with the at least one network link partner via the at least one Ethernet protocol link;
- determining error information associated with received Ethernet protocol frame data, the error information comprising respective counts of codewords of the received Ethernet protocol frame data that include respective numbers of symbol errors, the respective counts of codewords comprising:
  - a first count of codewords of the received Ethernet protocol frame data that include a first number of symbol errors; and
  - a second count of codewords of the received Ethernet protocol frame data that include a second number of symbol errors, the second number of symbol errors being greater than the first number of symbol errors; and storing the error information in the at least one machine-readable memory.

29. The non-transitory computer-readable memory of claim 28, wherein:
the respective counts of codewords comprise fifteen respective counts of codewords;
the respective numbers of symbol errors comprise fifteen respective numbers of symbol errors; and
the respective numbers of symbol errors are mutually different from each other.

30. The non-transitory computer-readable memory of claim 29, wherein:
the codewords of the received Ethernet protocol frame data comprise forward error correction (FEC) codewords; and
the hardware integrated circuitry comprises Reed-Solomon decoder circuitry for use in association with the error information.

31. A method implemented by hardware integrated circuitry, the hardware integrated circuitry being for use in association with at least one Ethernet protocol network link partner coupled to at least one Ethernet protocol link, the hardware integrated circuitry comprising at least one machine-readable memory and hardware transceiver circuitry, the hardware transceiver to be coupled via the at least one Ethernet protocol link to the at least one Ethernet protocol link partner, the method comprising:
carrying out, using the hardware transceiver circuitry, Ethernet protocol frame communication with the at least one network link partner via the at least one Ethernet protocol link;
determining error information associated with received Ethernet protocol frame data, the error information comprising respective counts of codewords of the received Ethernet protocol frame data that include respective numbers of symbol errors, the respective counts of codewords comprising:
a first count of codewords of the received Ethernet protocol frame data that include a first number of symbol errors; and
a second count of codewords of the received Ethernet protocol frame data that include a second number of symbol errors, the second number of symbol errors being greater than the first number of symbol errors; and
storing the error information in the at least one machine-readable memory.

32. The method of claim 31, wherein:
the respective counts of codewords comprise fifteen respective counts of codewords;
the respective numbers of symbol errors comprise fifteen respective numbers of symbol errors; and
the respective numbers of symbol errors are mutually different from each other.

33. The method of claim 32, wherein:
the codewords of the received Ethernet protocol frame data comprise forward error correction (FEC) codewords; and
the hardware integrated circuitry comprises Reed-Solomon decoder circuitry for use in association with the error information.

\* \* \* \* \*